(12) United States Patent
Sugawara et al.

(10) Patent No.: US 12,051,744 B2
(45) Date of Patent: Jul. 30, 2024

(54) SEMICONDUCTOR DEVICE

(71) Applicant: Mitsubishi Electric Corporation, Tokyo (JP)

(72) Inventors: Katsutoshi Sugawara, Tokyo (JP); Yutaka Fukui, Tokyo (JP); Rina Tanaka, Tokyo (JP); Hideyuki Hatta, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 488 days.

(21) Appl. No.: 17/289,727

(22) PCT Filed: Dec. 23, 2019

(86) PCT No.: PCT/JP2019/050295
§ 371 (c)(1),
(2) Date: Apr. 29, 2021

(87) PCT Pub. No.: WO2020/145109
PCT Pub. Date: Jul. 16, 2020

(65) Prior Publication Data
US 2022/0005947 A1 Jan. 6, 2022

(30) Foreign Application Priority Data
Jan. 8, 2019 (JP) ................................ 2019-000983

(51) Int. Cl.
*H01L 29/78* (2006.01)
*H01L 29/06* (2006.01)
*H01L 29/417* (2006.01)

(52) U.S. Cl.
CPC ...... *H01L 29/7813* (2013.01); *H01L 29/0696* (2013.01); *H01L 29/41775* (2013.01)

(58) Field of Classification Search
CPC ... H01L 21/28; H01L 21/822; H01L 21/8234; H01L 21/76898; H01L 21/823487;
(Continued)

(56) References Cited

U.S. PATENT DOCUMENTS

2008/0073707 A1  3/2008 Darwish
2009/0206924 A1  8/2009 Zeng et al.
(Continued)

FOREIGN PATENT DOCUMENTS

DE  11 2018 002 873 T5  2/2020
JP  2005-322949 A  11/2005
(Continued)

OTHER PUBLICATIONS

Office Action issued Jan. 25, 2023 in German Patent Application No. 11 2019 006 587.4 and English translation thereof, 19 pages.
(Continued)

*Primary Examiner* — Cuong B Nguyen
*Assistant Examiner* — Anthony A Pulatov
(74) *Attorney, Agent, or Firm* — XSENSUS LLP

(57) ABSTRACT

An object is to provide a technique capable of reducing a parasitic capacitance in a semiconductor device with high accuracy. A semiconductor device includes: a base region; a source region; a second trench passing through the base region to reach the drift layer; a second protective layer disposed in a bottom portion of the second trench; a source electrode, at least part of which is disposed in the second trench, to be electrically connected to a first protective layer, the base region, and the source region; and a source side connection layer of a second conductivity type constituting at least part of a lateral portion of the second trench and connected to the base region and the second protective layer.

18 Claims, 15 Drawing Sheets

(58) Field of Classification Search
CPC ... H01L 23/481; H01L 23/5384; H01L 27/04; H01L 27/088; H01L 29/7813; H01L 29/0696; H01L 29/41775; H01L 29/1095; H01L 29/1608; H01L 29/0623; H01L 29/0878; H01L 29/66068; H01L 29/78; H01L 29/42356; H01L 29/4236; H01L 29/7825; H01L 29/66613–66628; H01L 29/42336; H01L 29/42352; H01L 29/66325–66348; H01L 29/7393–7398; H01L 29/76898; H01L 29/66666; H01L 29/66712–66734; H01L 29/7802–7815; H01L 29/7827–7828; H01L 29/78642; H01L 2924/13055; H01L 2225/06541; H01L 51/057; H01L 21/743; H01L 29/083–0834; H01L 29/66333–66348
See application file for complete search history.

(56) References Cited

U.S. PATENT DOCUMENTS

| | | | |
|---|---|---|---|
| 2011/0108911 | A1 | 5/2011 | Matsuoka |
| 2013/0306983 | A1* | 11/2013 | Nakano ............... H01L 29/1608 438/270 |
| 2017/0170288 | A1 | 6/2017 | Kiyosawa et al. |
| 2017/0345905 | A1* | 11/2017 | Siemieniec ......... H01L 29/1095 |
| 2018/0158920 | A1 | 6/2018 | Siemieniec et al. |
| 2018/0323285 | A1* | 11/2018 | Darwish ............ H01L 29/41766 |
| 2020/0243641 | A1* | 7/2020 | Nakagawa ........ H01L 29/66734 |
| 2021/0288156 | A1 | 9/2021 | Fukui et al. |
| 2022/0149167 | A1 | 5/2022 | Fukui et al. |

FOREIGN PATENT DOCUMENTS

| | | | |
|---|---|---|---|
| JP | 2008-227514 | A | 9/2008 |
| JP | 2010-505270 | A | 2/2010 |
| JP | 2011-512677 | A | 4/2011 |
| JP | 2011-100877 | A | 5/2011 |
| JP | 2014-207326 | A | 10/2014 |
| JP | 2015-195307 | A | 11/2015 |
| JP | 2017-220667 | A | 12/2017 |
| WO | 2005/065385 | A2 | 7/2005 |
| WO | 2008/039459 | A1 | 4/2008 |
| WO | 2009/102684 | A2 | 8/2009 |
| WO | 2016/038833 | A1 | 3/2016 |
| WO | 2017/175460 | A1 | 10/2017 |

OTHER PUBLICATIONS

International Search Report and Written Opinion mailed on Mar. 17, 2020 received for PCT Application PCT/JP2019/050295, Filed on Dec. 23, 2019, 12 pages including English Translation.

Office Action issued Jan. 5, 2024 in Chinese Patent Application No. 201980087624.2, 28 pages.

* cited by examiner

F I G. 1 7
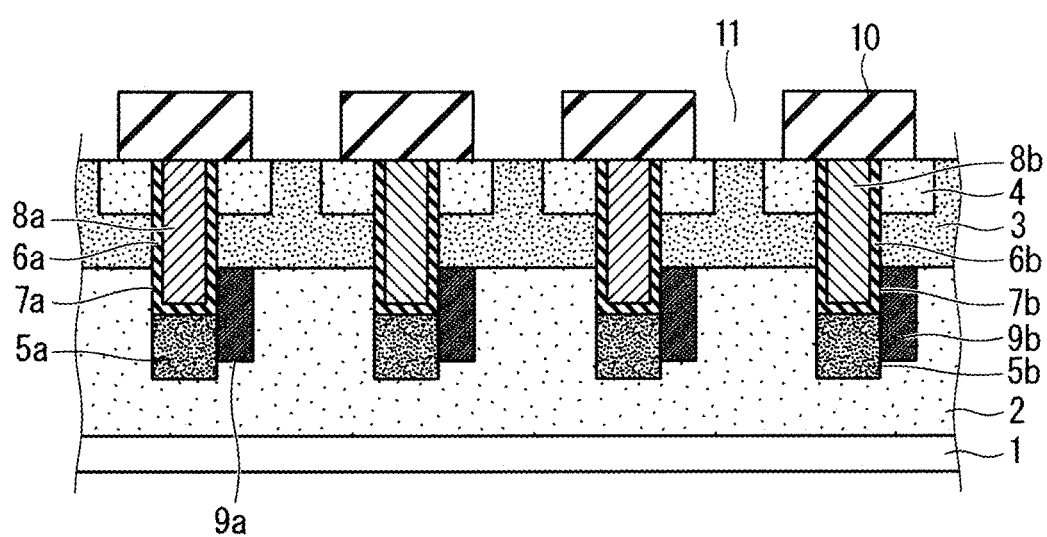

SEMICONDUCTOR DEVICE

CROSS-REFERENCE TO RELATED APPLICATIONS

The present application is based on PCT filing PCT/JP2019/050295, filed Dec. 23, 2019, which claims priority to JP 2019-000983, filed Jan. 8, 2019, the entire contents of each are incorporated herein by reference.

TECHNICAL FIELD

The present disclosure relates to a semiconductor device and a power conversion device including the semiconductor device.

BACKGROUND ART

Insulated gate type semiconductor devices such as an insulated gate bipolar transistor (IGBT) and a metal oxide semiconductor field effect transistor (MOSFET) are widely used as a switching element controlling a power supply to a load such as a motor in a power electronics equipment. A vertical type MOSFET for power control includes a trench gate type MOSFET in which a gate electrode is embedded into a semiconductor layer.

In the meanwhile, a MOSFET and an IGBT using a wideband gap semiconductor such as silicon carbide (SiC), for example, attract attention as a next-generation switching element, and are highly expected to be applied to a technical field handling high voltage of approximately 1 kV or more. Examples of the wideband gap semiconductor include not only SiC but also a gallium nitride (GaN) series material and diamond.

An operation frequency of the switching element needs to be increased, that is to say, the switching element needs to be operated at high speed to downsize an inverter circuit using the switching element. An SiC-MOSFET is considered to be promising from the viewpoint that it can be operated at high speed several times as high as a conventional Si-IGBT. Examples of a power loss in the switching element include a conduction loss occurring when the MOSFET is in a conductive (ON) state between a drain and a source and a switching loss occurring when ON and OFF of the MOSFET are switched. When the operation frequency of the MOSFET increases, the number of times of switching increases, thus a ratio of the switching loss in the total loss increases.

A parasitic capacitance of the MOSFET significantly involves the switching loss. The parasitic capacitance of the MOSFET includes three types of capacitance, that is, a drain-source capacitance (Cds), a gate-drain capacitance (Cgd), and a gate-source capacitance (Cgs). Particularly, Cgd significantly involves the switching loss, thus when Cgd is reduced, the switching loss can be reduced. When ON and OFF of the MOSFET are switched, a depletion layer expands and contracts, and a displacement current flows in accordance with this charge movement. The displacement current flows from a drain to a gate via Cgd, and fluctuates a gate voltage. The fluctuation exceeds a threshold voltage at which ON and OFF of the MOSFET are switched, the gate is turned on in a state where high voltage is applied between the drain and the source, thus a large electrical power is applied to the MOSFET and the MOSFET is damaged in a worst case. Cgd needs to be reduced to prevent this condition. Patent Document 1 indicates a technique of dividing a gate electrode embedded in a trench in a vertical direction by sandwiching an insulating film in an intermediate portion of the gate electrode and makes a lower electrode have source potential, thereby reducing Cgd.

The conduction loss is determined by a drain-source current and ON resistance of the MOSFET. A trench type MOSFET can have a larger channel width density than a normal planar MOSFET, thus the ON resistance per unit area can be reduced. Furthermore, when a hexagonal system material such as SiC is used, a current path of the trench gate type MOSFET coincides with an a-axis direction in which a carrier mobility is high, thus significant reduction in the ON resistance is expected. However, the trench type MOSFET for controlling the electrical power has a problem that an electrical field is concentrated in a bottom portion of the trench, thereby easily leading to a breakdown of a gate oxide film. When the breakdown of the gate oxide film occurs, the element does not operate as the MOSFET, thus the concentration of the electrical field in the bottom portion of the trench needs to be prevented in the trench type MOSFET.

Widely known is a technique of providing a protective layer having a conductivity type opposite from a substrate in the bottom portion of the trench to prevent the concentration of the electrical field in the bottom portion of the trench. The protective layer is provided in the bottom portion of the trench, thus a depletion layer can be expanded from the protective layer to the substrate, and as a result, the electrical field in the bottom portion of the trench can be reduced. Patent Document 2 indicates a technique of connecting a protective layer to a base region along a trench to draw out a displacement current associated with an expansion and contraction of a depletion layer, thereby increasing a switching speed. Furthermore, Patent Document 3 indicates a technique of thinning out a part of cells constituting a MOSFET and connecting a protective layer to a source electrode via the thinned part, thereby increasing a switching speed more effectively.

PRIOR ART DOCUMENTS

Patent Documents

Patent Document 1: Japanese Patent Application Laid-Open No. 2008-227514
Patent Document 2: Japanese Patent Application Laid-Open No. 2005-322949
Patent Document 3: Japanese Patent Application Laid-Open No. 2011-100877

SUMMARY

Problem to be Solved by the Invention

An electrical field tends to be concentrated in a bottom portion of a gate trench of a trench type MOSFET at a time when high voltage is blocked, thus a bottom portion protective layer having a conductivity type different from a substrate is provided to protect the bottom portion in some cases as described above. In this case, a depletion layer between the bottom portion protective layer and a drift layer expands. When an operation of the MOSFET is switched from ON to OFF, this depletion layer expands and blocks a current path. In contrast, when the operation thereof is switched from OFF to ON, the depletion layer contracts and the current path is opened. A response speed of this depletion layer is controlled by a speed until the displacement current disappears. This time is longer than the switching time, so that a sufficiently high switching speed cannot be obtained by the above configuration. In the technique of Patent Document 2, the bottom portion protective layer is expanded to the base region along the trench to be electrically connected to a source electrode. In this case, the displacement current is drawn to the source electrode, thus the effect of increasing the switching speed is obtained. Patent Document 3 indicates a technique of appropriately omitting the cells operating as the MOSFET, thereby providing the region to ground the bottom portion protective layer to the source electrode. In this technique, resistance from the bottom portion protective layer to the source electrode is reduced, thus a higher effect than that of the technique of Patent Document 2 is obtained.

However, none of the techniques of Patent Document 2 and Patent Document 3 reduces the parasitic capacitance of the MOSFET. Furthermore, there is a possibility that a gate voltage may oscillate depending on a component such as an inductor (L) and a capacitor (C) included in a gate driver circuit driving the MOSFET and a value of parasitic capacitance of the MOSFET. Thus, useful is the technique of controlling the parasitic capacitance not by reducing simply the parasitic capacitance but by reducing the parasitic capacitance with high accuracy. In Patent Document 1, the gate electrode embedded in the trench is divided in the vertical direction, and the lower electrode is connected not to the gate but to the source, thus Cgd is partially changed to Cgs. However, this technique needs to be applied to all of the gate electrodes for convenience of processes, thus is appropriate for a rough control of Cgd, but hardly controls the capacitance with high accuracy.

The present disclosure is therefore has been made to solve problems as described above, and it is an object of the present disclosure to provide a technique capable of reducing a parasitic capacitance in a semiconductor device with high accuracy.

Means to Solve the Problem

A semiconductor device according to the present disclosure includes: a semiconductor part of a first conductivity type; a drift layer of a first conductivity type disposed on a first main surface of the semiconductor part; a base region of a second conductivity type disposed on the drift layer; a source region of a first conductivity type selectively disposed on an upper portion of the base region; at least one first trench passing through the source region and the base region to reach the drift layer; a first protective layer of a second conductivity type disposed under or below at least part of a bottom portion of the first trench; an in-trench gate electrode disposed adjacent to the source region and the base region via an insulating film in the first trench; at least one second trench passing through the base region to reach the drift layer; a second protective layer of a second conductivity type disposed under or below at least part of a bottom portion of the second trench; a source electrode, at least part of which is disposed in the second trench, to be electrically connected to the first protective layer, the base region, and the source region; a source side connection layer of a second conductivity type constituting at least part of a lateral portion of the second trench and connected to the base region and the second protective layer; and a drain electrode disposed on a second main surface of the semiconductor part on a side opposite to the first main surface.

Effects of the Invention

According to the present disclosure, a source side connection layer constituting at least part of a lateral portion of the second trench and connected to the base region and the second protective layer is included. Accordingly, a parasitic capacitance in the semiconductor device can be reduced with high accuracy.

These and other objects, features, aspects and advantages of the technique disclosed in the present disclosure will become more apparent from the following detailed description of the specification of the present application when taken in conjunction with the accompanying drawings.

BRIEF DESCRIPTION OF DRAWINGS

FIG. 17 A process chart illustrating a method of manufacturing the semiconductor device according to the embodiment 1.

DESCRIPTION OF EMBODIMENT(S)

Figure 1:
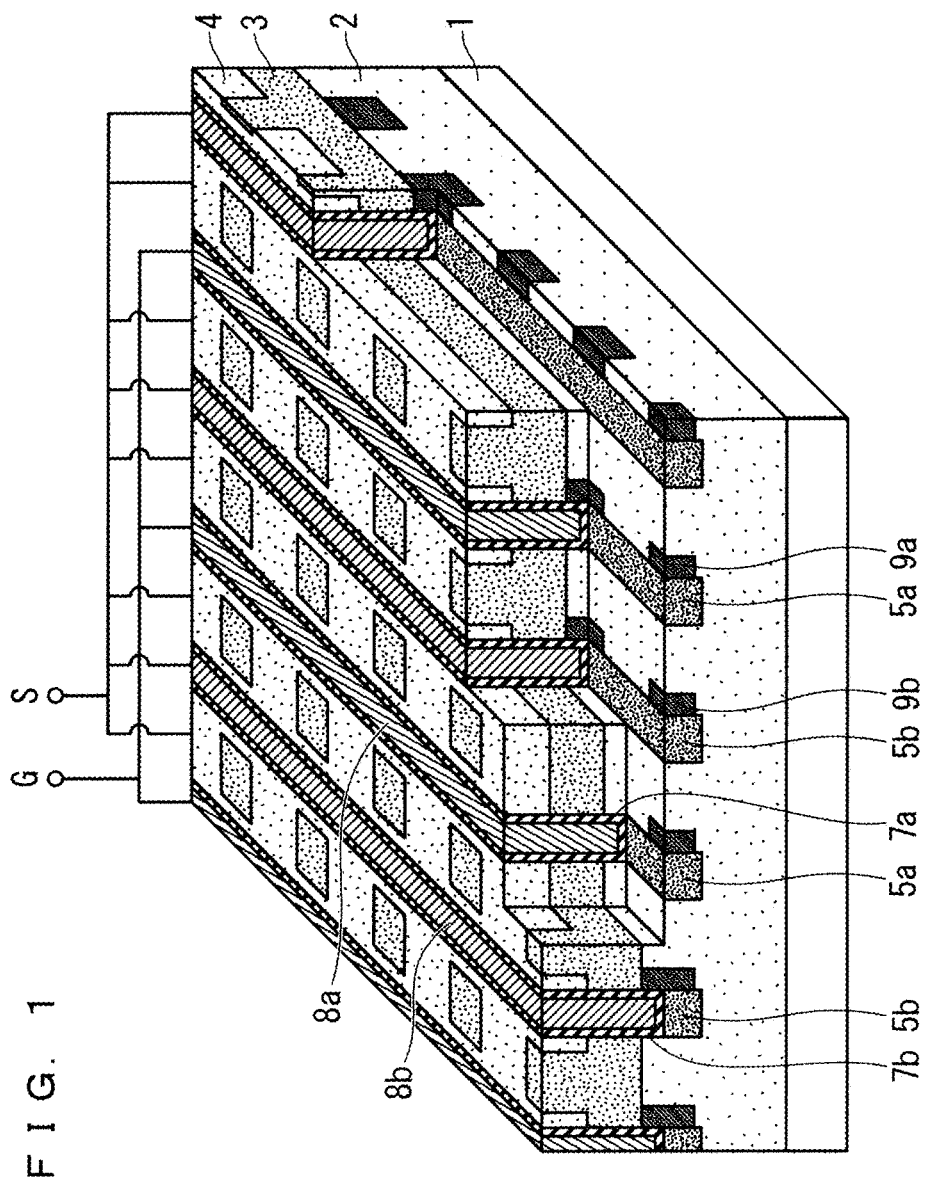
FIG. 1 A schematic view illustrating a semiconductor device according to an embodiment 1.

An embodiment of a semiconductor device according to the present disclosure is described in detail hereinafter based on the drawings. The present disclosure is not limited to the following description, but can be arbitrarily modified without departing from the scope of the present disclosure. A scale of each member is different from an actual state for easy understanding in the drawings illustrated hereinafter, and a structure may be partially omitted in some cases. The same applies to a relationship between the drawings.

Embodiment 1

Figure 2:
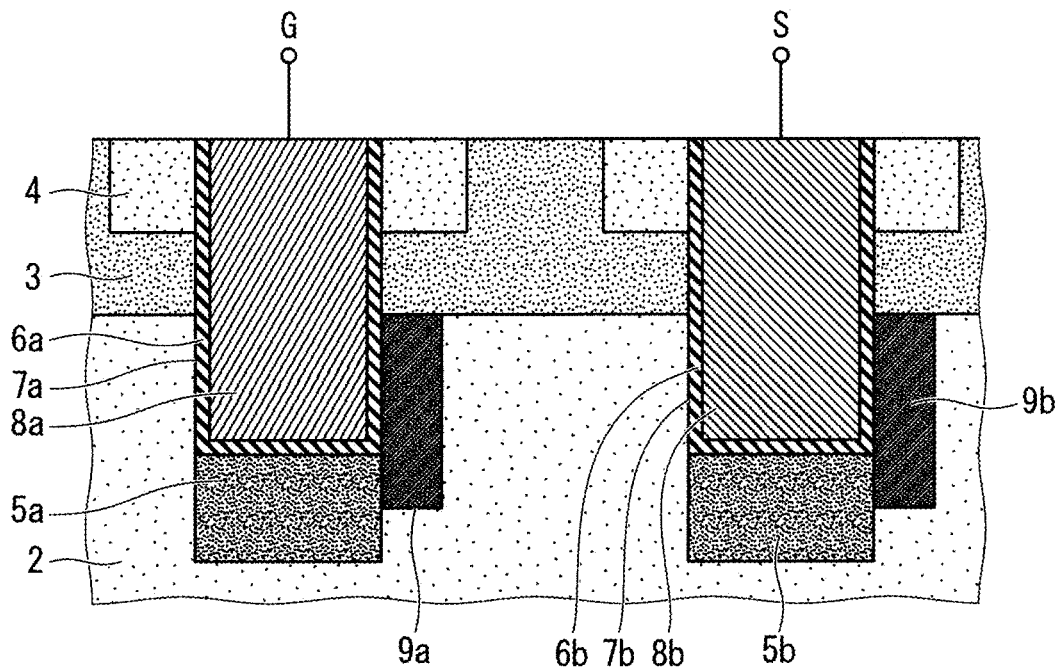
FIG. 2 A cross-sectional view illustrating the semiconductor device according to the embodiment 1.

FIG. 1 and FIG. 2 are diagrams illustrating a configuration of a semiconductor device according to the present embodiment 1. Herein, a trench type MOSFET which is a silicon carbide (SiC) semiconductor device is described as an example of the semiconductor device. FIG. 1 is a schematic diagram of the MOSFET viewed obliquely. FIG. 2 is an enlarged cross-sectional view of an arrangement of sidewall connection layers 9a and 9b in FIG. 1. In the description in the present embodiment 1, a first conductivity type and a second conductivity type are an n type and a p type, respectively, but may also be a p type and an n type, respectively.

A configuration of a MOSFET according to the present embodiment 1 is described firstly. The MOSFET according to the present embodiment 1 includes an SiC substrate 1 which is an n-type semiconductor part, an n-type drift layer 2, a p-type base region 3, and an n-type source region 4. The drift layer 2 is disposed on a first main surface of the SiC substrate 1, the base region 3 is disposed on the drift layer 2, and the source region 4 is selectively disposed on an upper side of the base region 3.

This configuration is obtained by preparing an epitaxial substrate made up of the SiC substrate 1 and an n-type SiC epitaxial layer (semiconductor layer) grown on the SiC substrate 1, forming the p-type base region 3 on an upper side of the epitaxial layer, further selectively forming the source region 4 thereon, and making a remaining part of the epitaxial layer function as the drift layer 2. The n-type semiconductor part may be an epitaxial layer in place of the SiC substrate 1 which is the semiconductor substrate, and in such a case, the SiC substrate 1 may be removed by a rear surface grinding, for example.

As illustrated in FIG. 2, the MOSFET according to the present embodiment 1 includes a bottom portion protective layer 5a which is a p-type first protective layer, an oxide film 6a which is an insulating film, a gate trench 7a which is a first trench, an in-trench gate electrode 8a, and the sidewall connection layer 9a which is a gate-side connection layer.

The gate trench 7a passes through the source region 4 and the base region 3 to reach the drift layer 2. The plurality of gate trenches 7a in FIG. 1 are disposed in a stripe form in a planar view, but may be disposed in a lattice form in a planar view.

The oxide film 6a which is a gate oxide film covering a sidewall and a bottom portion of the gate trench 7a is disposed in the gate trench 7a, and the in-trench gate electrode 8a is further embedded inside the oxide film 6a. That is to say, the in-trench gate electrode 8a is disposed adjacent to the source region 4 and the base region 3 via the oxide film 6a in the gate trench 7a. The in-trench gate electrode 8a may be a polysilicon electrode connected to a gate pad of the MOSFET, for example, or may also be a metal electrode.

In the example in FIG. 1 and FIG. 2, the bottom portion protective layer 5a is disposed under the whole bottom portion of the gate trench 7a. The configuration of the bottom portion protective layer 5a is not limited thereto, however, it is sufficient that the bottom portion protective layer 5a is disposed under or below at least part of the bottom portion of the gate trench 7a. For example, the bottom portion protective layer 5a may be disposed at intervals along a longitudinal direction of the gate trench 7a in a planar view, or may also be disposed to cover a half of the bottom portion of the gate trench 7a in a cross section perpendicular to the longitudinal direction. The bottom portion protective layer 5a may also be disposed below the whole bottom portion of the gate trench 7a. The bottom portion protective layer 5a may also have a configuration of covering the bottom portion of the gate trench 7a to stick out from the gate trench 7a in a width direction thereof so that a width of the bottom portion protective layer 5a is larger than that of the gate trench 7a.

The sidewall connection layer 9a constitutes at least part of a lateral portion of the gate trench 7a, and is connected to the base region 3 and the bottom portion protective layer 5a. As illustrated in FIG. 1, when the sidewall connection layers 9a are intermittently disposed along the longitudinal direction of each gate trench 7a in a planar view, the side wall connection layers 9a may be disposed at a first interval or may also be non-periodically disposed. One sidewall connection layer 9a may be provided on a sidewall on one side of the gate trench 7a as illustrated in FIG. 2, or a pair of sidewall connection layers 9a may be provided on sidewalls on both sides of the gate trench 7a. Although not shown in FIG. 2, part of the drift layer 2 may be disposed between the gate trench 7a and the sidewall connection layer 9a.

Figure 3:
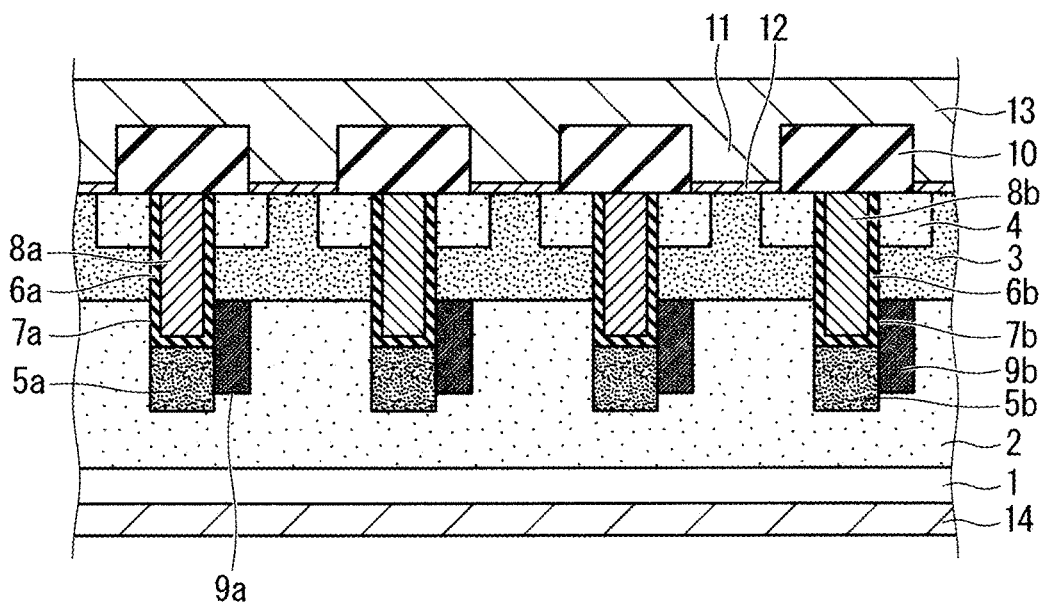
FIG. 3 A cross-sectional view illustrating the semiconductor device according to the embodiment 1.

The MOSFET according to the present embodiment 1 includes a bottom portion protective layer 5b which is a p-type second protective layer, an oxide film 6b which is an insulating film, a source trench 7b which is a second trench, a source electrode, and the sidewall connection layer 9b which is a source-side connection layer. The source electrode according to the present embodiment 1 includes an in-trench source electrode 8b and an on-trench source electrode 13 (FIG. 3). As clarified in the following description, at least part of this source electrode is disposed in the source trench 7b, and the source electrode is electrically connected to the bottom portion protective layer 5a, the base region 3, and the source region 4.

Herein, the bottom portion protective layer 5b, the oxide film 6b, the source trench 7b, the in-trench source electrode 8b, and the sidewall connection layer 9b are basically the same as the bottom portion protective layer 5a, the oxide film 6a, the gate trench 7a, the in-trench gate electrode 8a, and the sidewall connection layer 9a, respectively. Thus, only a main configuration of the bottom portion protective layer 5b, the oxide film 6b, the source trench 7b, the in-trench source electrode 8b, and the sidewall connection layer 9b is described hereinafter.

The source trench 7b in FIG. 1 and FIG. 2 passes through the source region 4 and the base region 3 to reach the drift layer 2. In the example in FIG. 1, the plurality of gate trenches 7a and the plurality of source trenches 7b are parallelly disposed in a stripe form in a planar view, however, the configuration thereof is not limited thereto.

The in-trench source electrode 8b is disposed adjacent to the source region 4 and the base region 3 via the oxide film 6b in the source trench 7b. The in-trench source electrode 8b may be a polysilicon electrode connected to the on-trench source electrode 13 (FIG. 3), or may also be a metal electrode. This in-trench source electrode 8b does not function as the gate electrode of the MOSFET, thus the in-trench gate electrode 8a and the in-trench source electrode 8b need to be electrically insulated from each other so that a short circuit does not occur between the gate and the source.

The base region 3 adjacent to the source trench 7b does not function as a channel of the MOSFET, thus the source region 4 adjacent to the source trench 7b needs not be provided. That is to say, the source trench 7b needs not pass through the source region 4, and the in-trench source electrode 8b needs not be disposed adjacent to the source region 4 via the oxide film 6b in the source trench 7b. However, the source region 4 needs to be patterned in this case.

The bottom portion protective layer 5b is disposed under or below at least part of the bottom portion of the source trench 7b as with the bottom portion protective layer 5a. The bottom portion protective layer 5b may be disposed under or below the whole bottom portion of the source trench 7b. The bottom portion protective layer 5b may be configured to have a width larger than that of the source trench 7b.

The sidewall connection layer 9b constitutes at least part of a lateral portion of the source trench 7b, and is connected to the base region 3 and the bottom portion protective layer 5b. As illustrated in FIG. 1, when the sidewall connection layer 9b is intermittently disposed along the longitudinal direction of each source trench 7b in a planar view, the sidewall connection layer 9b may be disposed at a second interval or may also be non-periodically disposed.

It is also applicable that one of the sidewall connection layer 9a of the gate trench 7a and the sidewall connection layer 9b of the source trench 7b is not provided, however, in this case, the corresponding bottom portion protective layers 5a and 5b need to be electrically connected to the on-trench source electrode 13. For example, when part of the bottom portion protective layer 5a which is not connected to the sidewall connection layer 9a is disposed to extend in an in-plane direction and connected to the bottom portion protective layer 5b connected to the sidewall connection layer 9b, the bottom portion protective layer 5a can be electrically connected to the on-trench source electrode 13.

A withstand voltage of the MOSFET depends on an interval between the bottom portion protective layers 5a and 5b provided in a bottom portion of a certain trench and the bottom portion protective layers 5a and 5b provided in a trench adjacent to the certain trench, thus it is preferable that the gate trench 7a and the source trench 7b are provided at a certain interval without distinction. Similarly, a depth of the gate trench 7a and a depth of the source trench 7b also have an influence on the withstand voltage of the MOSFET, thus it is preferable that the depth of the gate trench 7a and the depth of the source trench 7b are the same as each other without distinction. Although the depths can be different from each other, in such a case, formation conditions such as an impurity concentration and a depth of the bottom portion protective layers 5a and 5b are preferably different from each other between the gate trench 7a and the source trench 7b. It is also applicable that in the configuration that the source trenches 7b are provided adjacent to each other, part of one of the bottom portion protective layers 5b provided in the bottom portions of these trenches is provided to extend in an in-plane direction to be connected to the other one of the bottom portion protective layers 5b. Accordingly, particularly when the intervals between the gate trench 7a and the source trench 7b are the same as each other and large, an effect of increasing the withstand voltage of the MOSFET is obtained.

FIG. 3 is a cross-sectional view illustrating the MOSFET according to the present embodiment 1. As illustrated in FIG. 3, the MOSFET according to the present embodiment 1 includes an interlayer oxide film 10, an ohmic electrode 12, an on-trench source electrode 13, and a drain electrode 14 in addition to the constituent elements described above.

The interlayer oxide film 10 is disposed on an upper surface of the epitaxial layer and covers the in-trench gate electrode 8a. A contact hole 11 reaching the source region 4 and the base region 3 is provided in the interlayer oxide film 10. A low-resistance ohmic electrode 12 is disposed on the source region 4 and the base region 3 in the contact hole 11. The on-trench source electrode 13 disposed on the interlayer oxide film 10 is electrically connected to the source region 4 and the base region 3 through the ohmic electrode 12. As described above, the source region 4 and the base region 3 are electrically connected to the bottom portion protective layers 5a and 5b, thus the on-trench source electrode 13 is also electrically connected to the bottom portion protective layers 5a and 5b. The drain electrode 14 is disposed on a second main surface of the SiC substrate 1 on a side opposite to the first main surface.

Figure 4:
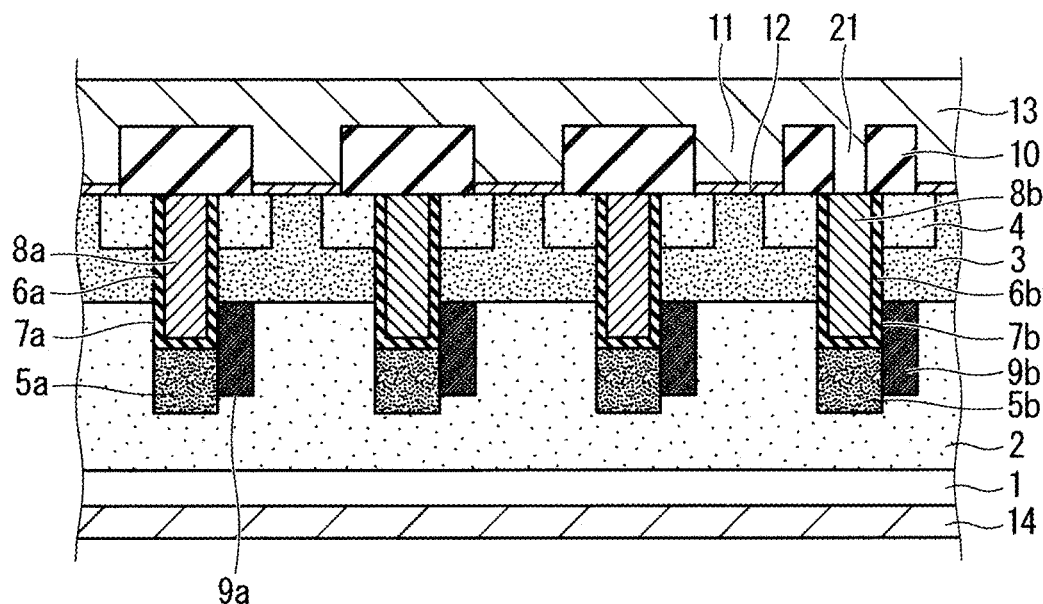
FIG. 4 A schematic view illustrating a modification example of the semiconductor device according to the embodiment 1.

In the configuration in FIG. 3 that the interlayer oxide film 10 is provided on the in-trench source electrode 8b, the interlayer oxide film 10 also covers the in-trench source electrode 8b. However, it is also applicable that a contact hole 21 exposing the in-trench source electrode 8b is provided in the interlayer oxide film 10 as illustrated in FIG. 4 to connect the in-trench source electrode 8b and the on-trench source electrode 13 on the interlayer oxide film 10. The on-trench source electrode 13 is connected to the in-trench source electrode 8b via the contact hole 21. Accordingly, an effect of stabilizing potential of the in-trench source electrode 8b is obtained. A position of an opening of this contact hole 21 may be located only in an outermost periphery of a MOSFET region or may also be located at constant interval in the MOSFET region.

Figure 5:
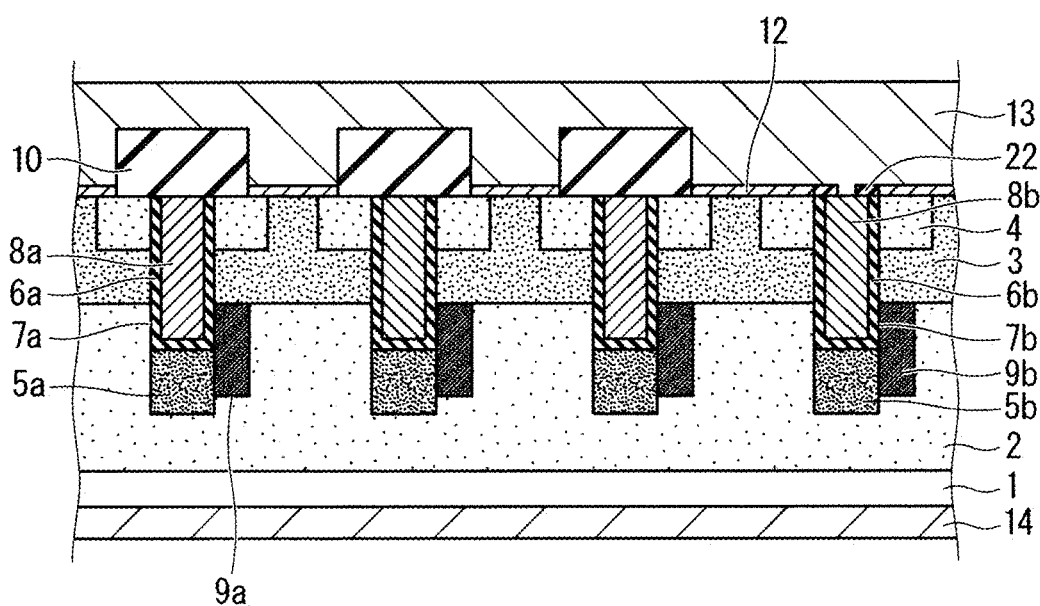
FIG. 5 A schematic view illustrating a modification example of the semiconductor device according to the embodiment 1.

When the contact hole 21 is formed, it may be formed to pass through the interlayer oxide film 10 as illustrated in FIG. 4, or may be formed to pass through an interlayer insulating film 22 which is separately formed to have a different film thickness as illustrated in FIG. 5. Examples of a method of forming this interlayer insulting film 22 include a deposition by chemical vapor deposition (CVD) method or thermal oxidation of the in-trench source electrode 8b.

Figure 6:
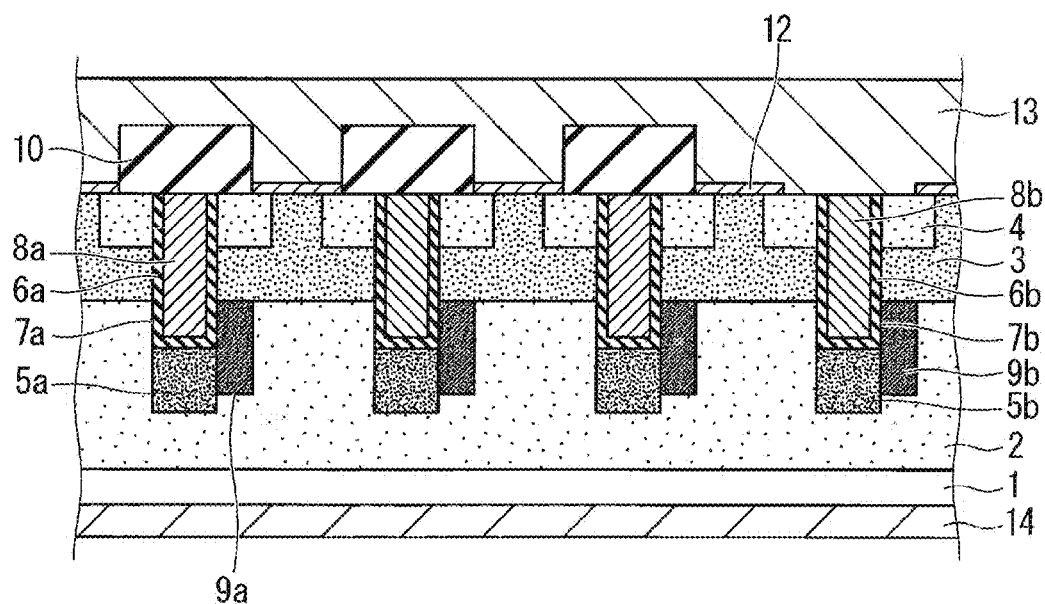
FIG. 6 A schematic view illustrating a modification example of the semiconductor device according to the embodiment 1.

As illustrated in FIG. 6, the in-trench source electrode 8b which is not covered by the interlayer oxide film 10 may be located. That is to say, the interlayer oxide film 10 needs not be provided between at least one of the in-trench source electrodes 8b and the on-trench source electrode 13. According to such a configuration, an area in which the on-trench source electrode 13 and the in-trench source electrode 8b have contact with each other increases, thus an effect of stabilizing potential of the in-trench source electrode 8b can be increased.

Figure 7:
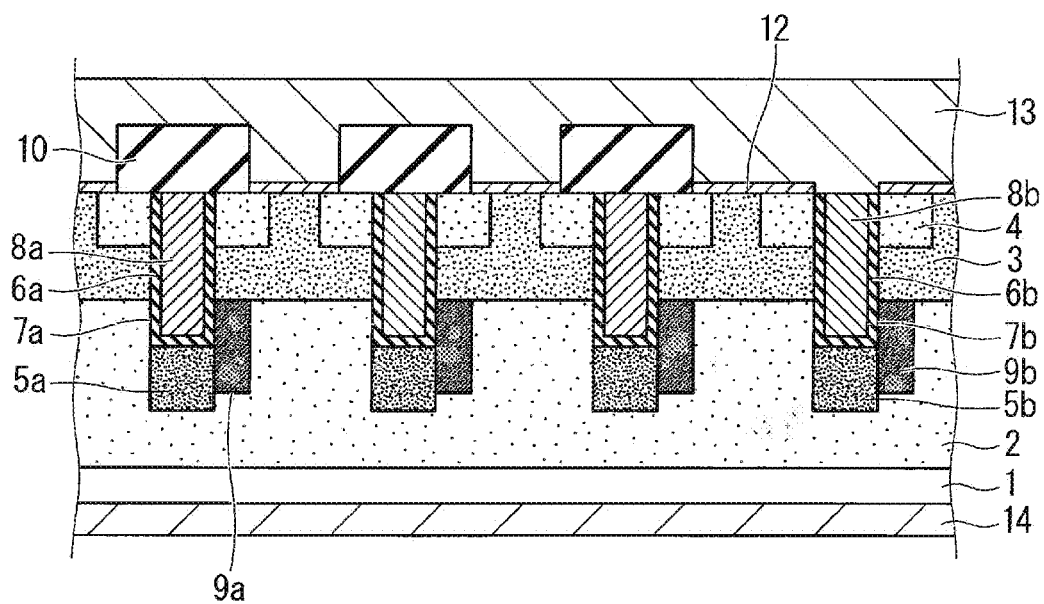
FIG. 7 A schematic view illustrating a modification example of the semiconductor device according to the embodiment 1.

As illustrated in FIG. 7, the ohmic electrode 12 electrically connecting the on-trench source electrode 13 and the source electrode 4 may be configured to have contact with the source trench 7b. According to such a configuration, a distance from the ohmic electrode 12 to the source trench 7b is reduced, thus the MOSFET can be further miniaturized and an effect of reducing ON resistance can be obtained. An area in which the ohmic electrode 12 has contact with the source region 4 increases, thus contact resistance is reduced, and an effect of increasing a switching response speed is also obtained.

The plurality of in-trench gate electrodes 8a and the plurality of in-trench source electrodes 8b in FIG. 1 and thus the plurality of gate trenches 7a and the plurality of source trenches 7b are parallelly disposed in a stripe form in a planar view. In the MOSFET region, a portion adjacent to the in-trench gate electrode 8a functions as the MOSFET. A plane having off angle (for example, an angle of four degrees) with respect to a (0001) plane which is a c plane of SiC crystal is generally used for a main surface of the SiC substrate 1. The plane has this off angle, thus crystal having a desired crystal structure can be grown in SiC crystal having crystal polymorph.

An atomic layer step occurs in a direction in which a direction having the off angle with respect to the main surface of the SiC substrate 1 is projected onto the main surface. In the description hereinafter, the direction which the atomic layer step occurs in the main surface of the SiC substrate 1 is referred to as "the step-flow direction".

When a longitudinal direction of each gate trench 7a and each source trench 7b in a planar view is parallel to a step-flow direction of the SiC substrate 1, the atomic layer step does not basically occur at an interface between the oxide films 6a and 6b and the SiC substrate 1. In the meanwhile, when the longitudinal direction of each gate trench 7a and each source trench 7b in a planar view is perpendicular to the step-flow direction of the SiC substrate 1, the atomic layer step occurs at the interface. This atomic layer step has an influence on an amount of interface level, and gate withstand voltage in the configuration that the longitudinal direction of the trench is parallel to the step-flow direction is larger than the gate withstand voltage in the other configuration. Thus, the longitudinal direction of each gate trench 7a and each source trench 7b in the MOSFET region in a planar view is preferably parallel to the step-flow direction of the SiC substrate 1.

However, according to the present embodiment 1, the plurality of sidewall connection layers 9a and 9b are disposed in a plane having many interface levels concentratively or over the whole plane, thus reduction in the gate withstand voltage can be suppressed. Thus, the longitudinal direction of each gate trench 7a and each source trench 7b in the MOSFET region in a planar view may be perpendicular to the step-flow direction of the SiC substrate 1.

A film thickness of the bottom portion of the oxide film 6a functioning as the gate oxide film may be larger than a film thickness of a lateral portion of the oxide film 6a. The thickness of the lateral portion of the oxide film 6a and the thickness of the bottom portion thereof illustrated in FIG. 2 are the same as each other, however, only the lateral portion of the oxide film 6a actually functions as the gate oxide film, and the bottom portion of the oxide film 6a does not contribute to the operation of the MOSFET. In addition, the electrical field tends to be concentrated in the bottom portion of the trench as described above, thus the breakdown of the oxide film occurs easily. Thus, only the bottom portion of the oxide film 6a is selectively thickened in addition to the configuration that the bottom portion protective layer 5a is disposed, thus the electrical field applied to the oxide film 6a on the gate side can be reduced.

Figure 8:
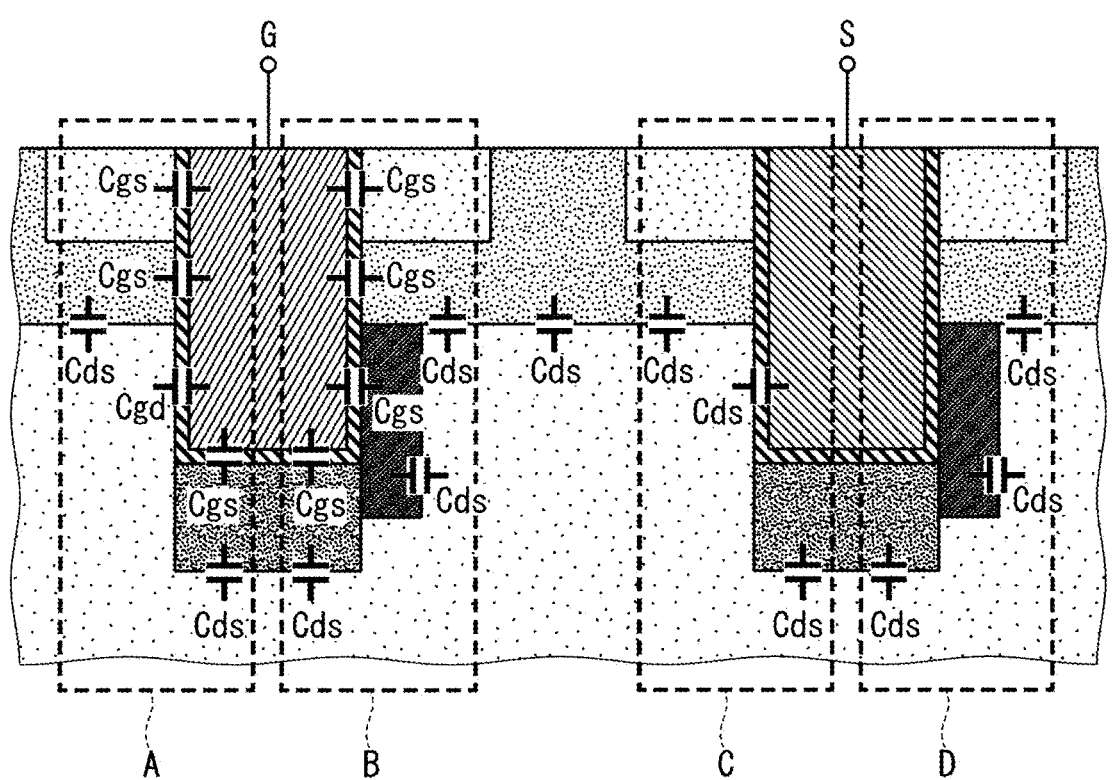
FIG. 8 A schematic view illustrating a position where a parasitic capacitance occurs in the semiconductor device according to the embodiment 1.
Figure 9:
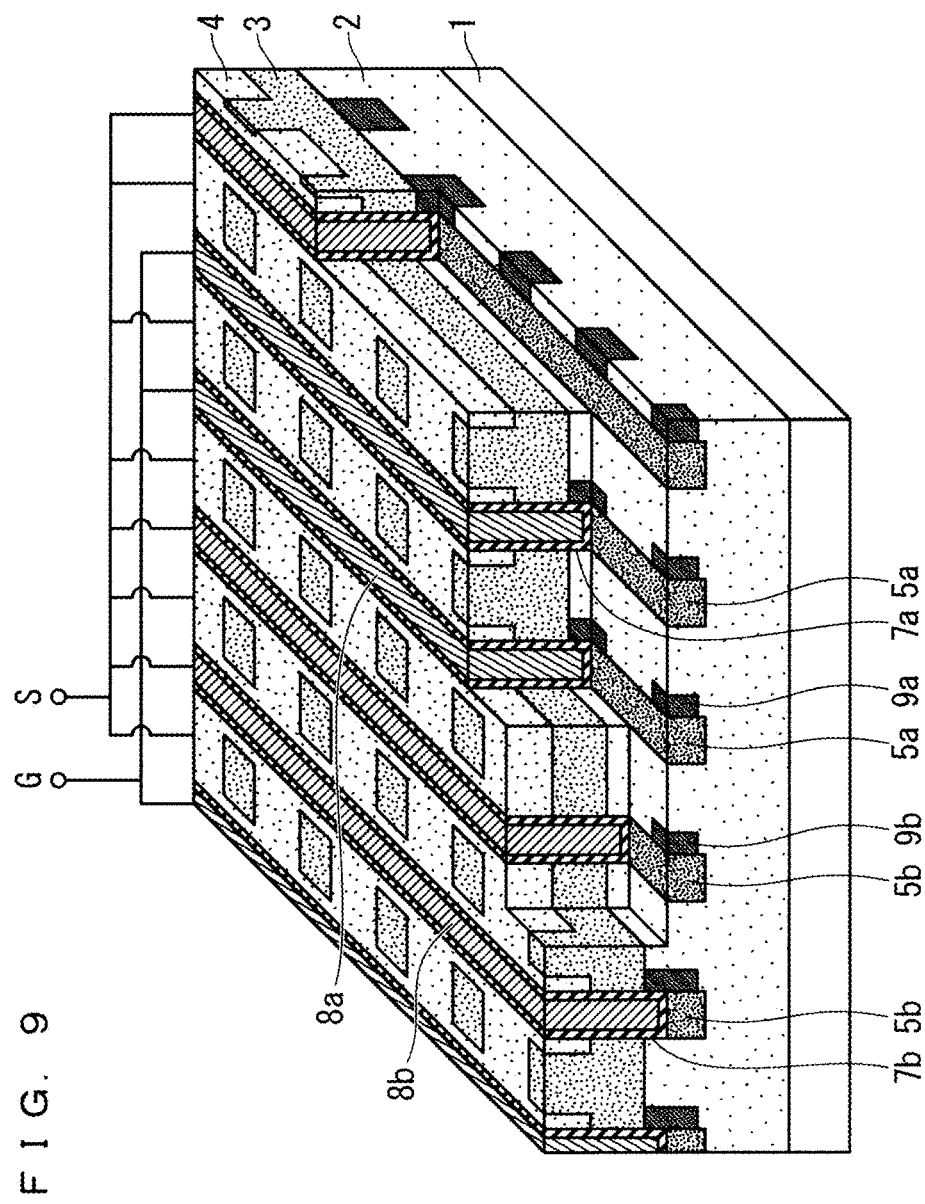
FIG. 9 A schematic view illustrating a modification example of the semiconductor device according to the embodiment 1.

Next, a characteristic structure of the MOSFET according to the present embodiment 1 and an effect thereof are described. FIG. 8 is a cross-sectional view illustrating a position where the parasitic capacitance of the MOSFET occurs according to the present embodiment 1. A region A in FIG. 8 corresponds to a normal MOSFET. In a configuration of the region A, the gate-source capacitance (Cgs) is present between the in-trench gate electrode 8a and each of the source region 4, the base region 3, and the bottom portion protective layer 5a. The gate-drain capacitance (Cgd) is present between the in-trench gate electrode 8a and the drift layer 2. In addition, the drain-source capacitance (Cds) is present between the drift layer 2 and each of the base region 3 and the bottom portion protective layer 5a. Cgs is almost determined by the oxide film 6a. Cgd is a capacitance via the oxide film 6a under a condition of low source-drain voltage, and is changed to a capacitance via the depletion layer expanding to a side of the drift layer 2 under a condition of high voltage. Cds is a capacitance via the depletion layer expanding to the side of the drift layer 2.

A region B corresponds to a configuration that the p-type sidewall connection layer 9a is added to the normal MOSFET (region A). In a configuration of the region B, the sidewall connection layer 9a is source potential, thus the capacitance of the portion which is Cgd in the region A is Cgs. Accordingly, when the region B is provided in place of the region A, Cgd of the region A can be partially changed to Cgs.

A region C corresponds to a configuration that the in-trench gate electrode 8a of the normal MOSFET (region A) is changed to the in-trench source electrode 8b. In the configuration of the region C, the in-trench source electrode 8b has the same source potential as the source region 4, the base region 3, and the bottom portion protective layer 5b, thus Cgs of the region A is totally reduced and substantially disappears. The capacitance of the portion which is Cgd in the region A is Cds. This Cds functions as the capacitance via the oxide film 6b on a low voltage side, and functions as the capacitance via the depletion layer on a high voltage side. As described above, when the region C is provided in place of the region A, Cgs of the region A can be reduced, and Cgd of the region A can be partially changed to Cds.

A region D corresponds to a configuration that the in-trench gate electrode 8a of the normal MOSFET (region A) is changed to the in-trench source electrode 8b, and the sidewall connection layer 9b is added. In the configuration of the region D, Cgs of the region A is reduced, and Cgd of the region A is Cds in the manner similar to the configurations of the region B and the region C. Herein, the low voltage side of Cds is the capacitance not via the oxide film 6b but via the depletion layer. According to the above configuration, when the region D is provided in place of the region A, Cds can be reduced compared to the region C.

A modification example of the MOSFET described above is described next. In the configurations described above, the gate trench 7a and the source trench 7b are alternately disposed and an arrangement ratio thereof is 1:1. However, the arrangement ratio may be changed in accordance with a design requirement of a circuit. That is to say, the number of the gate trenches 7a and the number of the source trenches 7b may be different from each other, and specifically, the number of one of the gate trenches 7a and the source trenches 7b may be larger than the number of the other one thereof.

The gate trench 7a and the source trench 7b need not be alternately disposed one by one, but may be disposed two by two such as a configuration of arranging the gate trench 7a, the gate trench 7a, the source trench 7b, the source trench 7b, . . . in this order.

Figure 10:
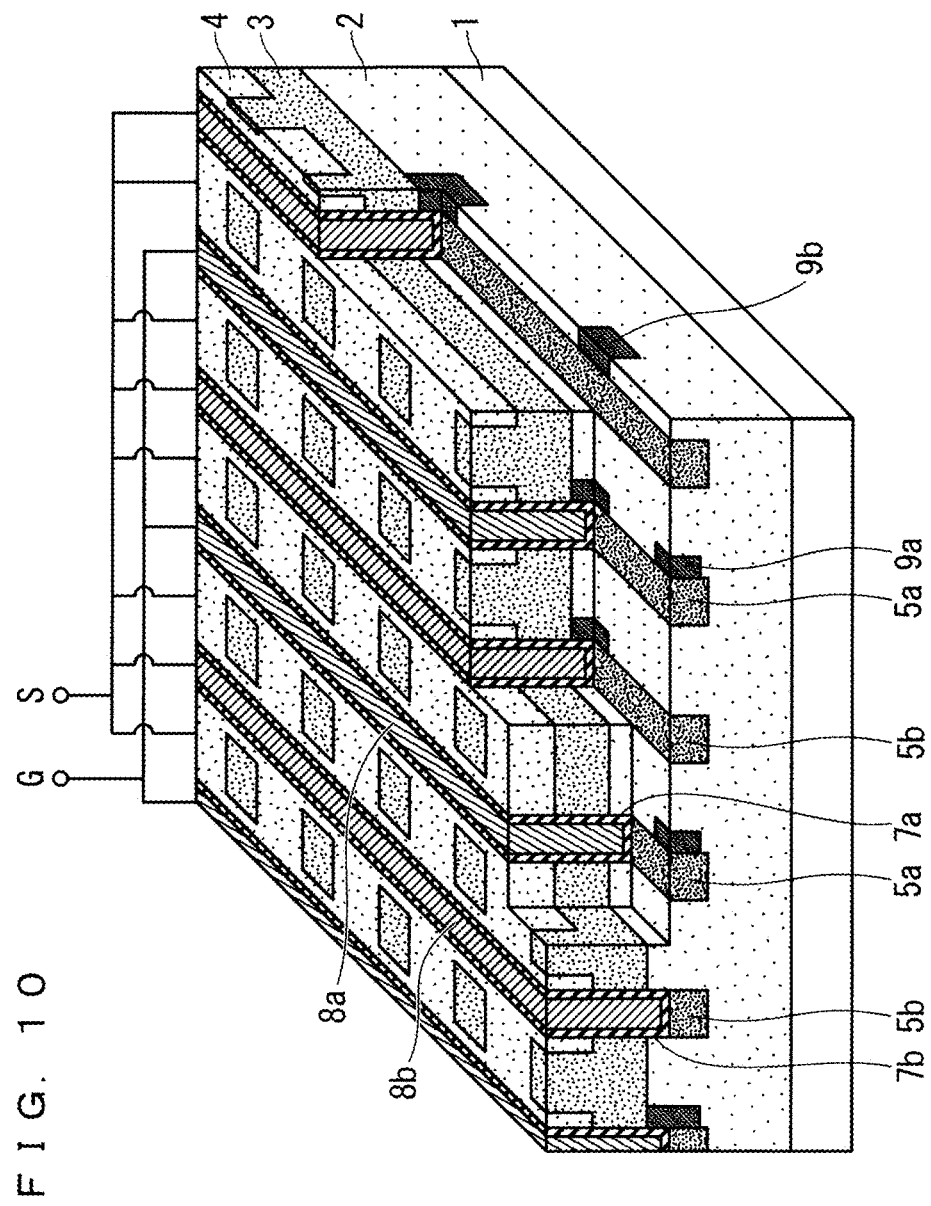
FIG. 10 A schematic view illustrating a modification example of the semiconductor device according to the embodiment 1.

As described above, the sidewall connection layers 9a and 9b may be disposed at any interval along the direction in which the trench extends, and may also be disposed on one side or both sides of the sidewall. Furthermore, as illustrated in FIG. 10, the arrangement ratio of the sidewall connection layers 9a and 9b in the direction in which the trench extends may be different between the gate trench 7a and the source trench 7b. That is to say, the first interval described above of the sidewall connection layer 9a and the second interval described above of the sidewall connection layer 9b may be different from each other.

Generally, the capacitance is preferably reduced, and even when the sidewall connection layer 9b is provided in the source trench 7b, the ON resistance does not increase. Thus, the arrangement ratio of the sidewall connection layer 9b of the source trench 7b may be larger than that of the sidewall connection layer 9a of the gate trench 7a. That is to say, the second interval described above of the sidewall connection layer 9b may be smaller than the first interval described above of the sidewall connection layer 9a.

These configurations can be changed only by changing a mask used in manufacturing the MOSFET, thus increase in a manufacturing cost in accordance with the change can be suppressed. Thus, the parasitic capacitance can be reduced with high accuracy and thus controllability of the parasitic capacitance can be improved by combining these configurations in accordance with the design requirement of the circuit without increase in the manufacturing cost.

When some of the gate trenches 7a are partially changed to the source trench 7b or the sidewall connection layer 9a is provided in the gate trench 7a, a channel density of the MOSFET slightly decreases, thus a resistance component caused by a channel slightly increases and as a result, the ON resistance slightly increases. However, a contribution of the resistance component caused by the channel of the trench-type MOSFET is smaller than a contribution thereof caused by the channel of a planar type MOSFET, thus an influence of decrease in the channel density in the trench-type MOSFET is smaller than that in the planar-type MOSFET. When the operation frequency is high, a ratio of the switching loss in the total loss of the whole MOSFET increases, and a contribution of a conduction loss depending on the ON resistance decreases, thus it is effective to reduce the switching loss by reducing the capacitance even when the ON resistance is sacrificed to some extent.

As described above, according to the present embodiment 1, the parasitic capacitance can be reduced with high accuracy by the sidewall connection layer 9b, thus the trench-type MOSFET in which the controllability of the parasitic capacitance is improved can be achieved.

<Manufacturing Method>

A method of manufacturing the MOSFET illustrated in FIG. 1 to FIG. 10 is described hereinafter. FIG. 11 to FIG. 17 are cross-sectional views each illustrating a process of the MOSFET illustrated in FIG. 1 to FIG. 10. Materials described hereinafter as examples can be appropriately changed to materials having equivalent functions.

Firstly, the epitaxial layer (semiconductor layer) is formed on the SiC substrate 1. For example, the n-type low resistance SiC substrate 1 having a polytype of 4H is prepared, and the semiconductor layer which is to be the n-type drift layer 2, for example, is epitaxially grown thereon by CVD method. The drift layer 2 has an impurity concentration of $1 \times 10^{14}$ cm$^{-3}$ to $1 \times 10^{17}$ cm$^{-3}$ and a thickness of 5 to 200 μm.

Figure 11:
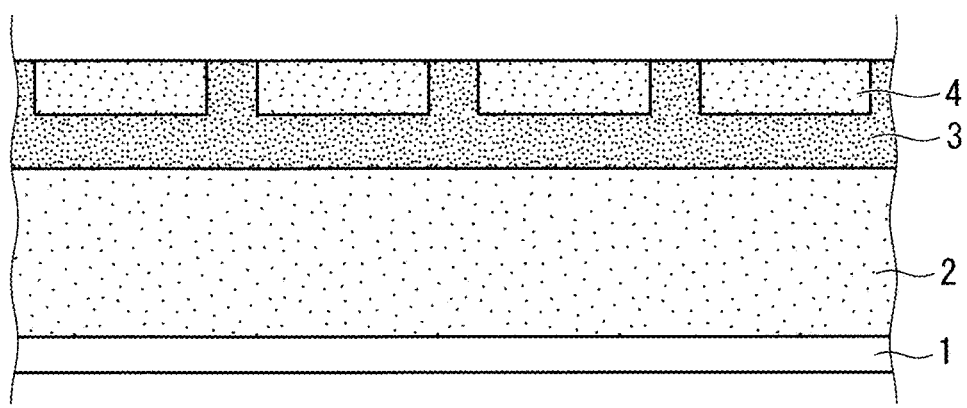
FIG. 11 A process chart illustrating a method of manufacturing the semiconductor device according to the embodiment 1.

Next, a predetermined dopant is ion-implanted into a surface of the epitaxial layer to form the base region 3 and the source region 4 (FIG. 11).

The base region 3 is formed by ion-implanting aluminum (Al) which is a p-type impurity. A depth of the ion implantation of Al is within a range not exceeding a thickness of the epitaxial layer, that is approximately 0.5 to 3 μm. The impurity concentration of the implanted Al is higher than an n-type impurity concentration of the epitaxial layer, and is within a range of $1 \times 10^{17}$ cm$^{-3}$ to $1 \times 10^{20}$ cm$^{-3}$. At this time, a region of the epitaxial layer deeper than the implantation depth of Al remains as the n-type drift layer 2. The base region 3 may be formed by a p-type epitaxial growth. An impurity concentration and thickness of the base region 3 which is epitaxially grown are similar to those of the base region 3 which is ion-implanted.

The source region 4 is formed by ion-implanting nitrogen (N) into a surface of the base region 3. An ion-implantation depth of N is shallower than the thickness of the base region 3. An impurity concentration of the implanted N is equal to or larger than the p-type impurity concentration of the base region 3, which is equal to or smaller than $1 \times 10^{21}$ cm$^{-3}$. The ion implantation for forming the above impurity regions needs not be necessarily performed in the order described above as long as the structure illustrated in FIG. 2 can be finally obtained.

Figure 12:
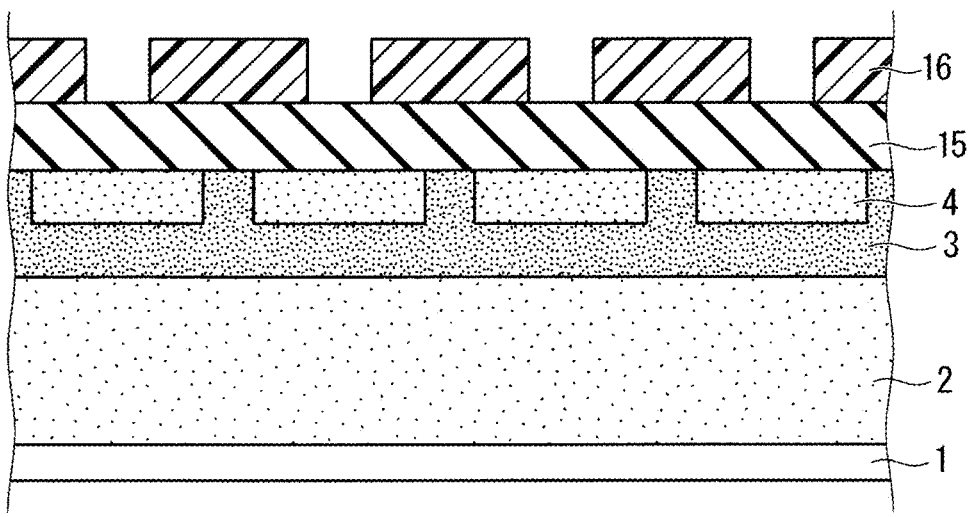
FIG. 12 A process chart illustrating a method of manufacturing the semiconductor device according to the embodiment 1.

Subsequently, the silicon oxide film 15 is deposited to have a thickness of approximately 1 to 2 μm on the surface of the epitaxial layer, and an etching mask 16 made up of a resist material is formed thereon (FIG. 12). The etching mask 16 is formed to have a pattern with an opening for a formation region of the trench by a photolithography technique. Then, the silicon oxide film 15 is patterned by reactive ion etching (RIE) processing using the etching mask 16 as a mask. That is to say, the pattern of the etching mask 16 is transferred to the silicon oxide film 15. The patterned silicon oxide film 15 becomes an etching mask for a next process.

Figure 13:
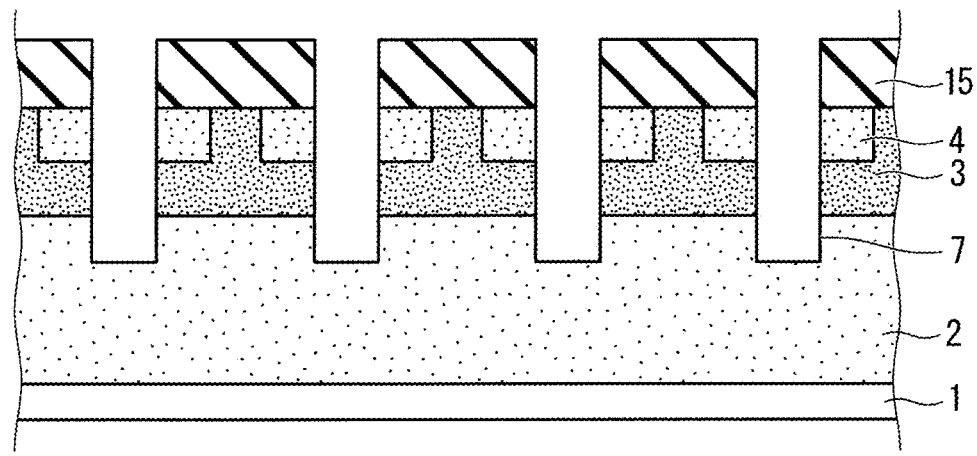
FIG. 13 A process chart illustrating a method of manufacturing the semiconductor device according to the embodiment 1.

The trench 7 passing through the source region 4 and the base region 3 is formed in the epitaxial layer by RIE using the patterned silicon oxide film 15 as the mask (FIG. 13). A depth of the trench 7 is equal to or larger than that of the base region 3, and is appropriately 1.0 to 6.0 μm.

Figure 14:
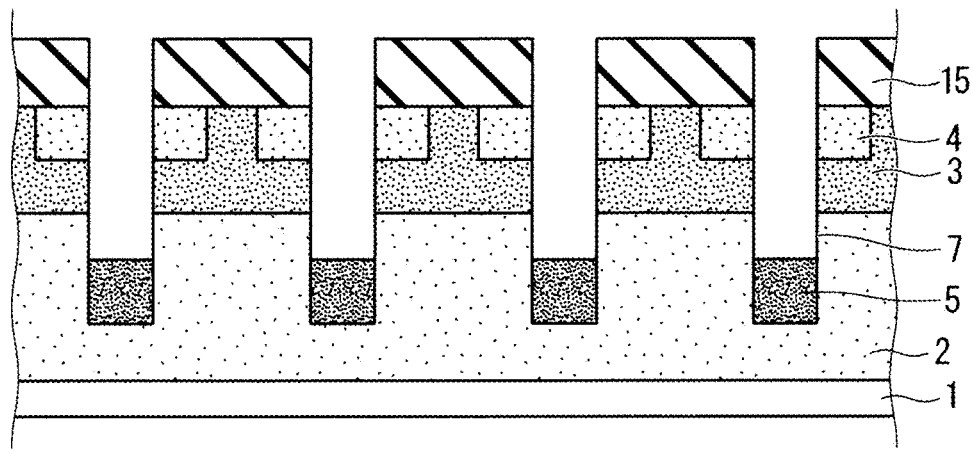
FIG. 14 A process chart illustrating a method of manufacturing the semiconductor device according to the embodiment 1.

Subsequently, an implantation mask (not shown) having a pattern with an opening in a portion of the trench 7 is formed, and the p-type bottom portion protective layer 5 is formed in the bottom portion of the trench 7 by the ion implantation using the implantation mask (FIG. 14). Herein, Al is used as a p-type impurity. An impurity concentration of the implanted Al is preferably within a range of $1 \times 10^{17}$ cm$^{-3}$ to $1 \times 10^{19}$ cm$^{-3}$, and a thickness thereof is preferably within a range of 0.1 to 2.0 μm. This Al impurity concentration is determined from an electrical field applied to the oxide film 6a which is the gate oxide film when the withstand voltage to be used is applied between the drain and the source of the MOSFET.

An etching mask at the time of forming the trench 7, that is to say, the patterned silicon oxide film 15 may be used in place of the implantation mask not shown in the drawings. Accordingly, the manufacturing process can be simplified and cost reduction can be achieved. When the silicon oxide film 15 is used, the thickness of the silicon oxide film 15 and the etching condition need to be adjusted so that the silicon oxide film 15 remains to have a certain degree of thickness after forming the trench. The bottom portion protective layer 5 forms a pn junction with the drift layer 2, thus can be used as a diode as with a pn junction between the base region 3 and the drift layer 2.

Figure 15:
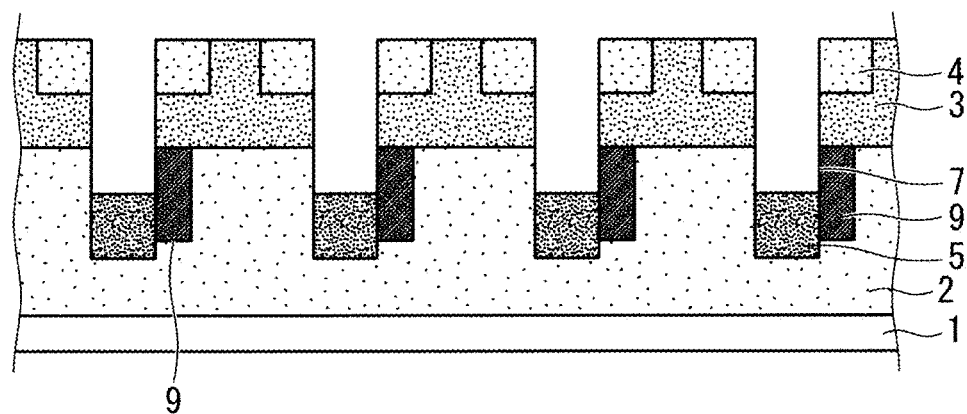
FIG. 15 A process chart illustrating a method of manufacturing the semiconductor device according to the embodiment 1.

After the implantation mask not shown in the drawings and the silicon oxide film 15 are removed, a p-type impurity is ion-implanted in the sidewall of the trench 7 from an oblique direction to form the sidewall connection layer 9 (FIG. 15). Herein, Al is used as a p-type impurity. An impurity concentration of the implanted Al is preferably within a range of $1\times10^{17}$ cm$^{-3}$ to $1\times10^{19}$ cm$^{-3}$, and a thickness thereof is preferably within a range of 0.1 to 2.0 µm. The sidewall connection layer 9 may be formed by ion implantation from an SiC surface. In this case, the ion implantation is preferably performed before opening the trench 7. A concentration and a thickness of the sidewall connection layer 9 in a case where the ion implantation from the SiC surface is used is similar to those of the sidewall connection layer 9 in a case where the impurity is implanted from the sidewall.

Next, annealing is performed to activate the impurity which is ion-implanted in the above process using a thermal processing device. This annealing is performed under conditions of a processing temperature of 1300 to 1900° C. and a processing time of 30 seconds to 1 hour in an inactive gas atmosphere such as argon (Ar) or a vacuum.

Figure 16:
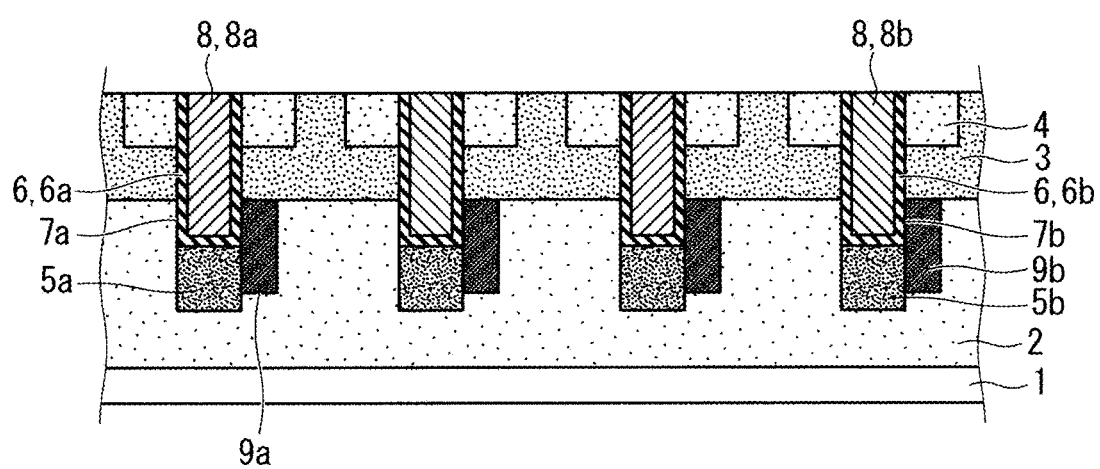
FIG. 16 A process chart illustrating a method of manufacturing the semiconductor device according to the embodiment 1.

After the silicon oxide film 6 is formed on the whole surface of the epitaxial layer including an inner side of the trench 7, a polysilicon electrode 8 is deposited by pressure reducing CVD method, and the patterning or etch back is performed thereon. In the above manner, the silicon oxide film 6 and the polysilicon electrode 8 are formed in the trench 7 (FIG. 16). The silicon oxide film 6 may be formed by thermally oxidizing the surface of the trench 7 of the epitaxial layer or deposited on the surface.

The polysilicon electrode 8 connected to a gate pad of the MOSFET, for example, becomes the in-trench gate electrode 8a. The bottom portion protective layer 5, the silicon oxide film 6, the trench 7, and the sidewall connection layer 9 corresponding to the in-trench gate electrode 8a become the bottom portion protective layer 5a, the oxide film 6a, the gate trench 7a, and the sidewall connection layer 9a, respectively. The polysilicon electrode 8 connected to the on-trench source electrode 13 becomes the in-trench source electrode 8b. The bottom portion protective layer 5, the silicon oxide film 6, the trench 7, and the sidewall connection layer 9 corresponding to the in-trench source electrode 8b become the bottom portion protective layer 5b, the oxide film 6b, the source trench 7b, and the sidewall connection layer 9b, respectively. The in-trench gate electrode 8a and the in-trench source electrode 8b are electrically insulated from each other.

Subsequently, the interlayer oxide film 10 is formed on the epitaxial layer, for example, by pressure reducing CVD method to cover the in-trench gate electrode 8a and the in-trench source electrode 8b. Then, the interlayer oxide film 10 is patterned to form the contact hole 11 reaching the source region 4 and the base region 3 (FIG. 17). At this time, the interlayer oxide film 10 on the in-trench source electrode 8b preferably remains as it is. Accordingly, silicidation of the in-trench source electrode 8b can be suppressed even when processing of siliciding SiC is performed using thermal processing to form the next ohmic electrode 12. As a result, it can be suppressed that the silicided polysilicon is significantly expanded to have a physical influence on the other structure.

Subsequently, the ohmic electrode 12 is formed on the surface exposed on the bottom of the contact hole 11. As a method of forming the ohmic electrode 12, a metal film having Ni as a main component is formed on the whole surface of the epitaxial layer in the contact hole 11, and the epitaxial layer and silicon carbide are reacted by thermal processing of 600 to 1100° C. to form a silicide film which becomes the ohmic electrode 12, for example. Subsequently, an unreacted metal film remaining on the interlayer oxide film 10 is removed by wet etching using nitric acid, sulfuric acid, or hydrochloric acid, or a compound liquid of any of them and hydrogen peroxide water, for example. The thermal processing may be performed again after removing a metal film remaining on the interlayer oxide film 10. When this thermal processing is performed at a higher temperature than that in the previous thermal processing, an ohmic contact having a further low contact resistance is formed. At this time, the interlayer oxide film 10 needs to be sufficiently thick to prevent the reaction between the polysilicon electrode such as the in-trench gate electrode 8a and the metal film.

After the ohmic electrode 12 is formed, an electrode material such as Al alloy is deposited on the interlayer oxide film 10 and in the contact hole 11 to form the on-trench source electrode 13. Finally, an electrode material such as Al alloy is deposited on a lower surface of the SiC substrate 1 to form the drain electrode 14. The MOSFET illustrated in FIG. 3 is thereby obtained.

Described above is the MOSFET having the structure in which the drift layer 2 and the SiC substrate 1 (buffer layer) have the same conductivity type. In the meanwhile, the present embodiment 1 can also be applied to an IGBT having a structure in which the drift layer 2 and the SiC substrate 1 have conductivity types different from each other. For example, when the SiC substrate 1 is a p type, the configuration of IGBT is achieved. In this case, the source region 4 and the on-trench source electrode 13 of the MOSFET correspond to an emitter region and an emitter electrode of the IGBT, respectively, and the drain electrode 14 of the MOSFET corresponds to a collector electrode of the IGBT.

Described in the present embodiment 1 is the semiconductor device formed using SiC which is one of the wide bandgap semiconductors, however, the present embodiment 1 can also be applied to a semiconductor device in which the other wide bandgap semiconductor such as a gallium nitride (GaN) series material and diamond, for example, is used.

Embodiment 2

Figure 18:
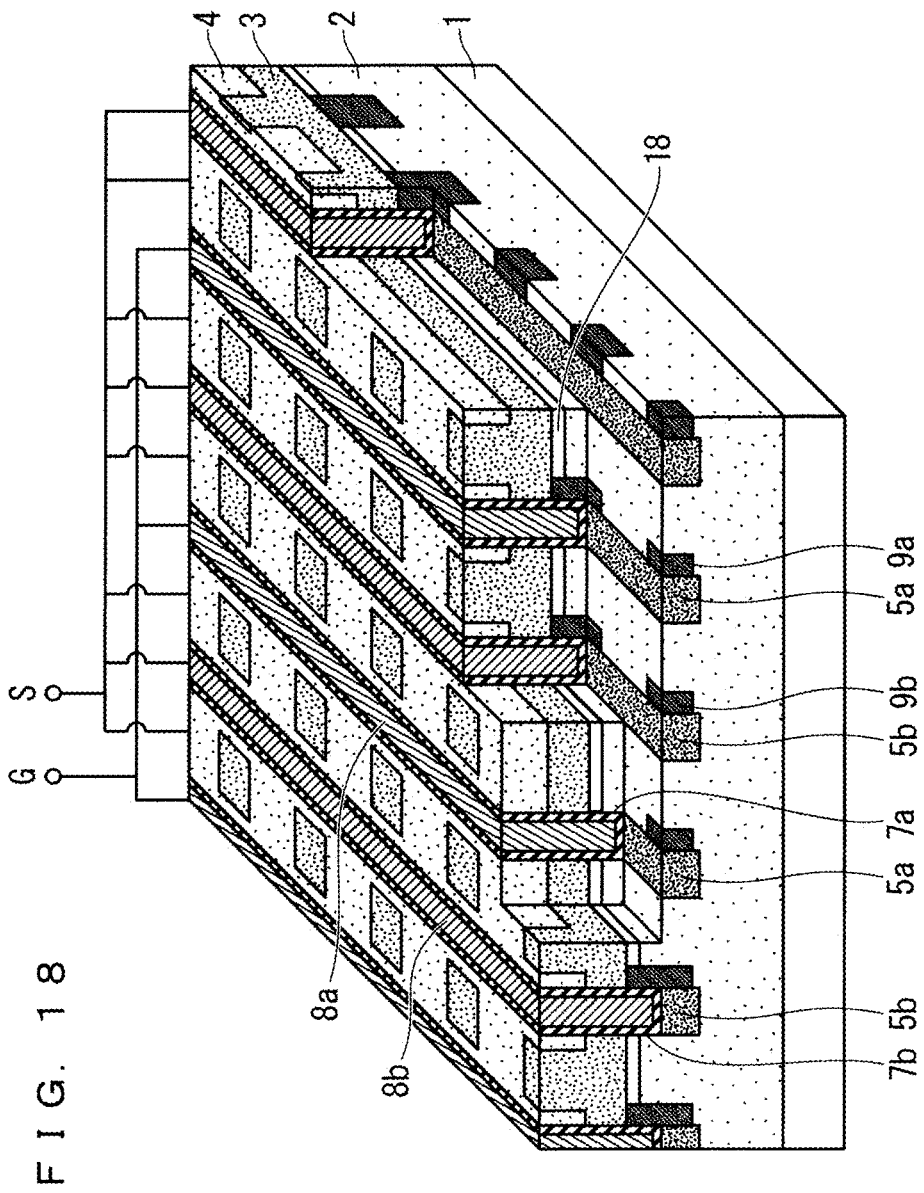
FIG. 18 A schematic view illustrating a semiconductor device according to an embodiment 2.
Figure 19:
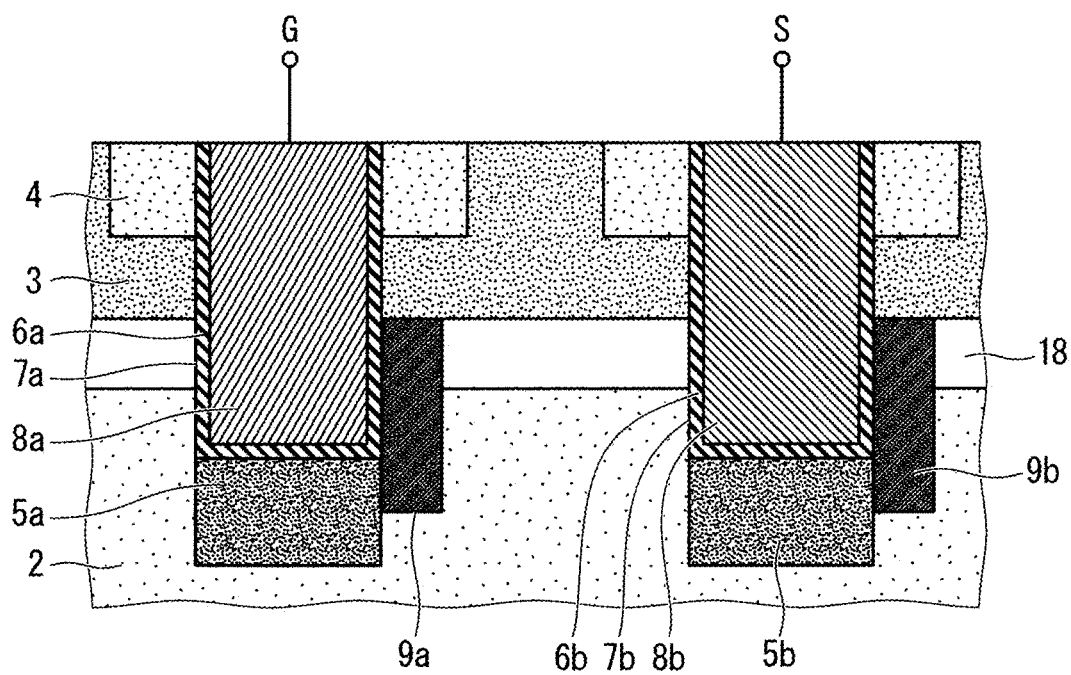
FIG. 19 A cross-sectional view illustrating the semiconductor device according to the embodiment 2.

FIG. 18 and FIG. 19 are diagrams illustrating a configuration of a semiconductor device according to the present embodiment 2. FIG. 18 is a schematic diagram of the MOSFET viewed obliquely. FIG. 19 is an enlarged cross-sectional view of an arrangement of the sidewall connection layers 9a and 9b in FIG. 18. The semiconductor device according to the present embodiment 2 is different from the semiconductor device according to the embodiment 1 only in that a depletion suppressing layer 18 is provided under the base region 3. The same reference numerals will be assigned to the same member as that in the embodiment 1, and elements different from those in the embodiment 1 are mainly described hereinafter.

A configuration of a MOSFET according to the present embodiment 2 is described. The controllability of the parasitic capacitance can be improved by combining the source trench 7b and the sidewall connection layers 9a and 9b also in the present embodiment 2 as with the embodiment 1. However, in the embodiment 1, Cds is mainly reduced, and Cds is hardly increased only by combining the source trench 7b and the sidewall connection layers 9a and 9b.

Thus, the n-type depletion suppressing layer 18 is provided under the base region 3 in the present embodiment 2. Accordingly, a thickness of the depletion layer extending from the base region 3 to the drift layer 2 can be reduced, thus Cds can be increased. As described above, Cgd is the capacitance via the oxide film 6a which is the gate oxide film in the low voltage region and via the depletion layer between the drain and the source in the high voltage region, however, Cgd can be sharply changed by providing the depletion suppressing layer 18.

Figure 20:
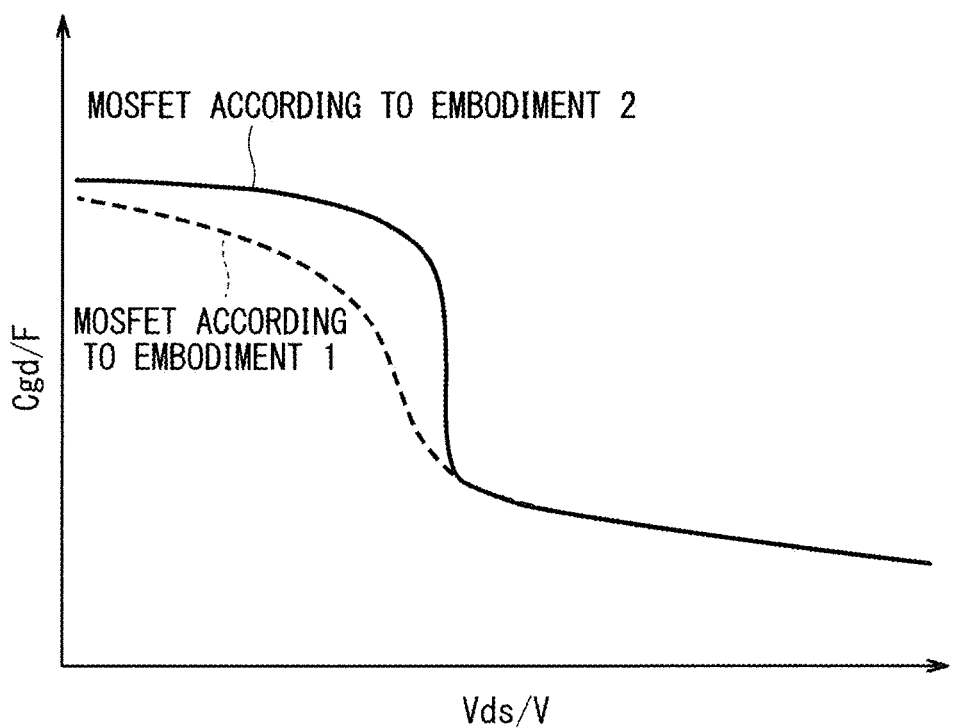
FIG. 20 A diagram illustrating voltage dependency of Cgd in the semiconductor devices according to the embodiments 1 and 2.

FIG. 20 is a diagram illustrating voltage dependency of Cgd in the MOSFET according to the embodiments 1 and 2. FIG. 20 illustrates a relationship between Cgd and drain voltage. Cgd in the MOSFET according to the embodiment 1 gradually decreases as the drain voltage makes a transition from a low voltage side to certain voltage, and when the drain voltage reaches the certain voltage, the depletion layer extending from the bottom portion protective layers 5a and 5b has contact, thus a degree of decrease in Cgd is slightly increased. In the meanwhile, in the MOSFET according to the present embodiment 2, the depletion layer extending from the base region 3 remains in the depletion suppressing layer 18, thus when the drain voltage is within a range from the low voltage side to the certain voltage, the degree of decrease in Cgd is small, and when the drain voltage reaches the certain voltage, Cgd rapidly decreases.

The depletion suppressing layer 18 is provided in a whole lower portion of the base region 3 in FIG. 19, however, it is sufficient that the depletion suppressing layer 18 has contact with at least part of the lower portion of the base region 3. According to such a configuration, Cgd on the low voltage side can be reduced. The depletion suppressing layer 18 may reach lateral surfaces of the bottom portion protective layers 5a and 5b to have contact with the lateral surfaces. Suppressed according to such a configuration is the expansion of the depletion layer in a planar surface direction from the bottom portion protective layers 5a and 5b, thus the voltage at which Cgd rapidly changes can be set high. Also in the present embodiment 2, the arrangement ratio and arrangement of the gate trench 7a and the source trench 7b and the arrangement ratio (interval) of the sidewall connection layers 9a and 9b can be optionally set as with the embodiment 1.

The depletion suppressing layer 18 is formed by ion-implanting nitrogen (N) or phosphorus (P), each of which is a n-type impurity. It is sufficient that the implantation of the n-type impurity is performed before forming the base region 3, for example. It is preferable that the depletion suppressing layer 18 disposed in a position deeper than the base region 3, and the thickness of the depletion suppressing layer 18 is approximately 0.5 to 3 µm within a range not exceeding the thickness of the drift layer 2. It is preferable that an impurity concentration of the implanted N is larger than the n-type impurity concentration of the drift layer 2, and is equal to or larger than $1 \times 10^{17}$ cm$^{-3}$.

The depletion suppressing layer 18 may also be formed by an n-type epitaxial growth. An impurity concentration and thickness of the depletion suppressing layer 18 which is epitaxially grown are similar to those of the depletion suppressing layer 18 which is ion-implanted. It is also applicable that the ion implantation is performed on the SiC substrate 1 from an oblique direction after the trench 7 is opened, and an n-type layer is formed as the depletion suppressing layer 18 at a constant depth from the sidewall from the trench 7. Particularly when the depletion suppressing layer 18 is formed up to a depth of 1 µm or more from the surface of the SiC substrate 1, high implantation energy is necessary, thus an implantation damage is considered to be increased. In contrast, the implantation energy can be suppressed when the ion implantation is performed from the oblique direction after the trench is opened. The concentration and thickness of the depletion suppressing layer 18 in the case of this ion implantation are similar to those of the depletion suppressing layer 18 in the case where the impurity is implanted from the surface thereof.

According to the present embodiment 2 described above, the depletion suppressing layer 18 having contact with at least the lower portion of the base region 3 is provided, thus the controllability of the parasitic capacitance can be further improved.

Embodiment 3

Figure 21:
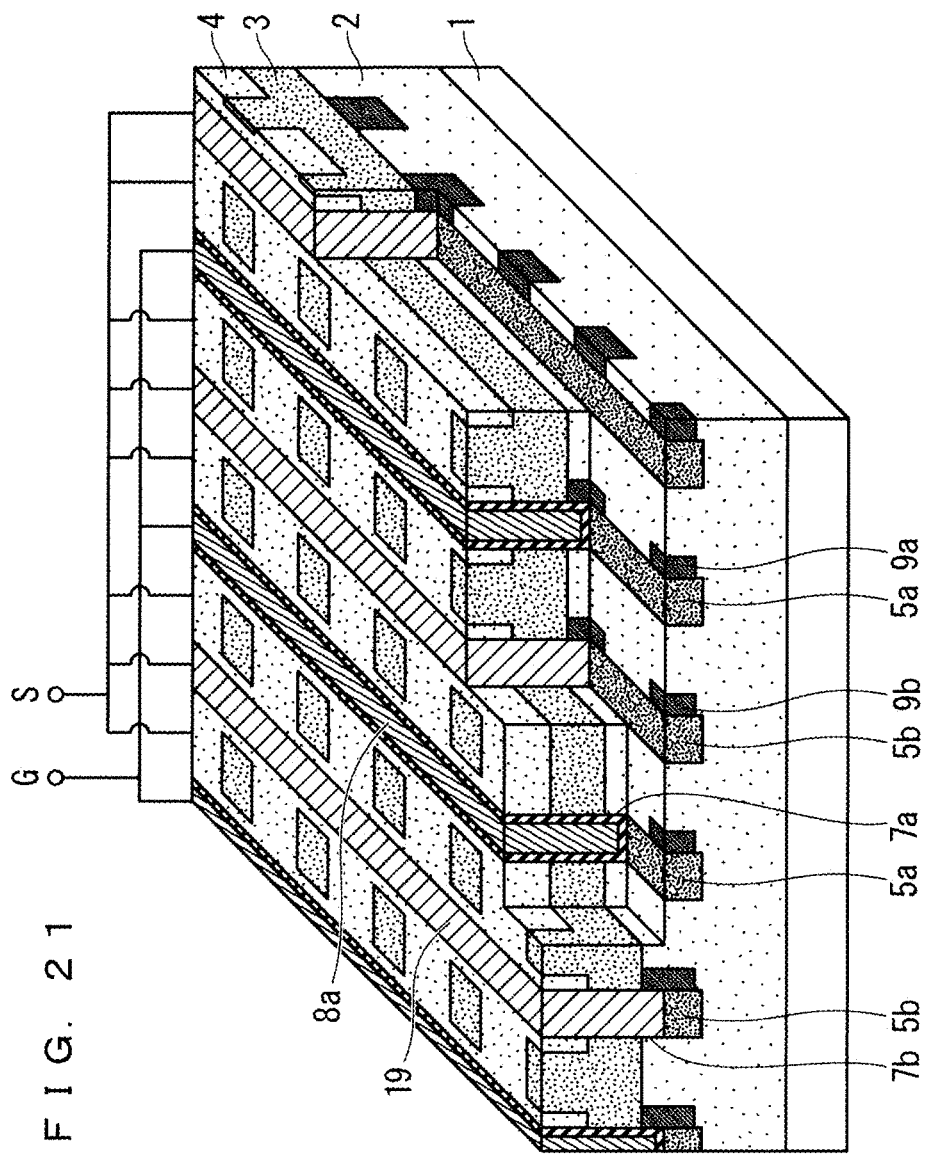
FIG. 21 A schematic view illustrating a semiconductor device according to an embodiment 3.
Figure 22:
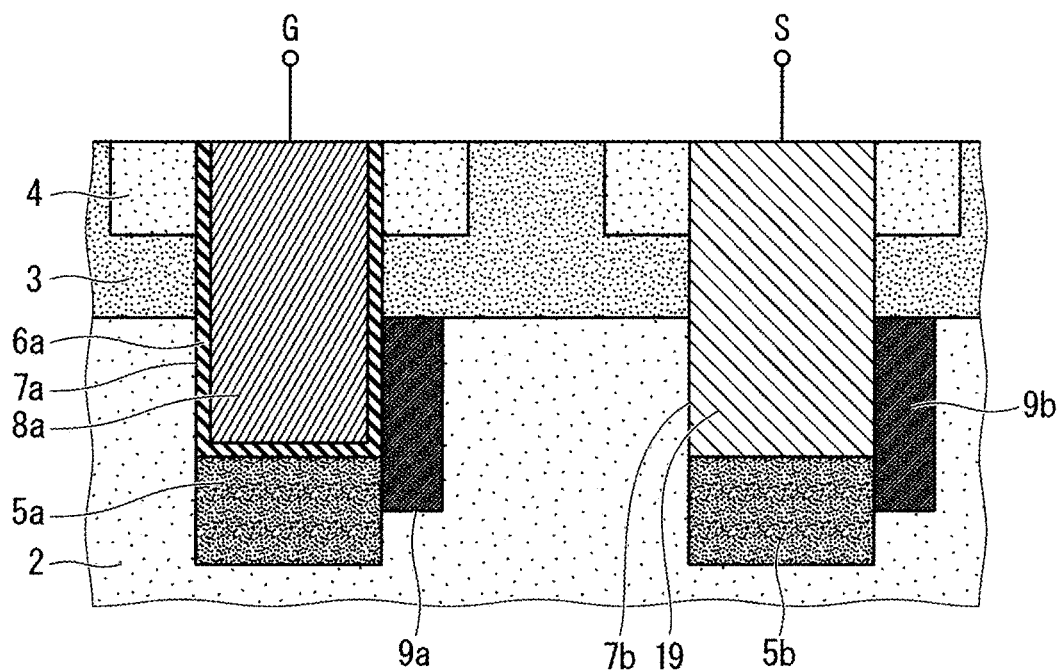
FIG. 22 A cross-sectional view illustrating the semiconductor device according to the embodiment 3.

FIG. 21 and FIG. 22 are diagrams illustrating a configuration of a semiconductor device according to the present embodiment 3. FIG. 21 is a schematic diagram of the MOSFET viewed obliquely. FIG. 22 is an enlarged cross-sectional view of an arrangement of the sidewall connection layers 9a and 9b in FIG. 21. The source electrode (FIG. 3) according to the embodiment 1 includes the in-trench source electrode 8b and the on-trench source electrode 13. In the same manner, the source electrode according to the present embodiment 3 includes a built-in electrode 19 which is an in-trench source electrode disposed in the source trench 7b and the on-trench electrode 13. The same reference numerals will be assigned to the same member as that in the embodiment 1, and elements different from those in the embodiment 1 are mainly described hereinafter.

A configuration of a MOSFET according to the present embodiment 3 is described. In the configuration of the embodiment 1 illustrated in FIG. 1, when a small number of sidewall connection layers 9b are disposed, there is concern that the displacement current flowing in the bottom portion protective layer 5b is drawn slowly. Thus, the MOSFET according to the present embodiment 3 includes the built-in electrode 19 electrically connected to the bottom portion protective layer 5a and connected to the base region 3, the source region 4, and the bottom portion protective layer 5b without intervention of the oxide film 6b. A metal electrode, for example, is used for the built-in electrode 19. The on-trench source electrode 13 is electrically connected to the bottom portion protective layer 5a, the base region 3, the source region 4, and the built-in electrode 19 which is the in-trench source electrode as with the embodiment 1.

According to such a configuration, the displacement current can be directly flowed from the bottom portion protective layer 5b to the built-in electrode 19, thus the displacement current can be immediately flowed to the on-trench source electrode 13 via the built-in electrode 19 even if the small number of sidewall connection layers 9b are disposed. The built-in electrode 19 preferably has ohmic contact with the bottom portion protective layer 5b.

An example of a structure of a configuration according to the present embodiment 3 is described. After the process in FIG. 16, the oxide film 6b and the polysilicon electrode 8 formed in the source trench 7b are removed. For example, an opening is formed also in the interlayer oxide film 10 on the source trench 7b at the time of forming the contact hole 11 in the interlayer oxide film 10 described in the embodiment 1 (FIG. 17), and wet etching is performed on the polysilicon electrode 8. A heated alkali solution or a compound liquid of hydrofluoric acid and nitric acid is used for the wet etching. The alkali solution does not etch the interlayer oxide film 10, thus can be used more easily than the compound liquid of hydrofluoric acid and nitric acid. Dry etching can also be used for removing the polysilicon electrode 8, however, required is attention on a condition that the epitaxial layer (SiC) is also etched at the time of removing all polysilicon embedded in the trench.

Subsequently, the oxide film 6b is removed, and the built-in electrode 19 is formed in the source trench 7b. Tungsten (W), for example, is used for the built-in electrode 19, and CVD, for example, is used for forming such a built-in electrode 19. The built-in electrode 19 is preferably formed in the source trench 7b with no space for reliability of the MOSFET. Also in the present embodiment 3, the arrangement ratio and arrangement of the gate trench 7a and the source trench 7b and the arrangement ratio (interval) of the sidewall connection layers 9a and 9b can be optionally set as with the embodiments 1 and 2. The depletion suppressing layer 18 described in the embodiment 2 may be provided in the present embodiment 3.

According to the preset embodiment 3 described above, the built-in electrode 19 is provided in the source trench 7b, thus a switching speed can be increased even when the small number of sidewall connection layers 9b are disposed.

Embodiment 4

A power conversion device according to the present embodiment 4 includes a main conversion circuit having the semiconductor device according to any one of the embodiments 1 to 3. The semiconductor device described above is not limited to a specific power conversion device, however, described hereinafter is a case where the semiconductor device according to any one of the embodiments 1 to 3 is applied to a three-phase inverter as the present embodiment 4.

Figure 23:
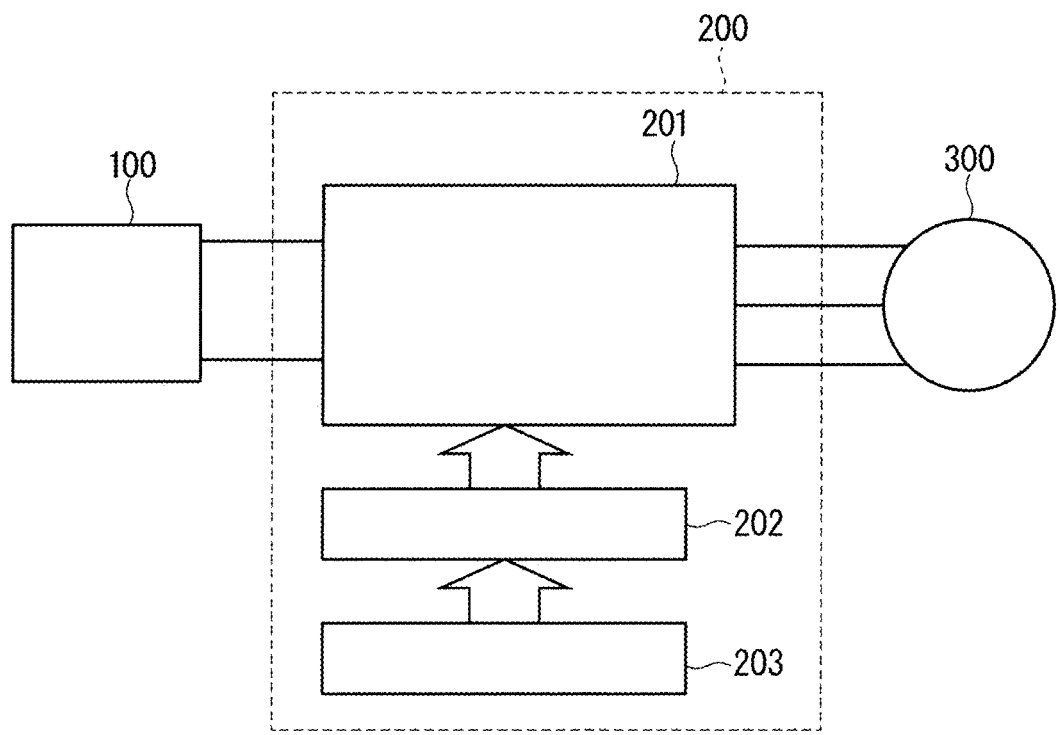
FIG. 23 A block diagram illustrating a power conversion device according to an embodiment 4.

FIG. 23 is a block diagram illustrating a configuration of a power conversion device to which the power conversion device according to the present embodiment 4 is applied.

The power conversion system illustrated in FIG. 23 includes a power source 100, a power conversion device 200, and a load 300. The power source 100 is a direct current power source and supplies a direct current power to the power conversion device 200. The power source 100 can be made up of various power sources, thus may be made up of a direct current system, a solar cell, or a storage battery, or a rectification circuit connected to an alternating current system or an AC/DC convertor, for example. The power source 100 may also be made up of a DC/DC convertor converting a direct current power output from the direct current system into a predetermined electrical power.

The power conversion device 200 is a three-phase inverter connected between the power source 100 and the load 300, converts the direct current power supplied from the power source 100 into the alternating current power, and supplies the alternating current power to the load 300. As illustrated in FIG. 23, the power conversion device 200 includes a main conversion circuit 201 converting the direct current power into the alternating current power to output the alternating current power, a drive circuit 202 outputting a drive signal for driving each switching element of the main conversion circuit 201, and a control circuit 203 outputting a control signal for controlling the drive circuit 202 to the drive circuit 202.

The load 300 is a three-phase electrical motor driven by the alternating current power supplied from the power conversion device 200. The load 300 is not for a specific purpose of usage, but is an electrical motor mounted on various types of electrical devices, thus is used as an electrical motor for a hybrid automobile, an electrical automobile, a railroad vehicle, an elevator, or an air-conditioning machine, for example.

Details of the power conversion device 200 are described hereinafter. The main conversion circuit 201 includes a switching element and a reflux diode (not shown), and when the switching element is switched, the main conversion circuit 201 converts the direct current power supplied from the power source 100 into the alternating current power, and supplies the alternating current power to the load 300. Examples of a specific configuration of the main conversion circuit 201 include various configurations, however, the main conversion circuit 201 according to the present embodiment 4 is a three-phase full-bridge circuit with two levels, and can be made up of six switching elements and six reflux diodes antiparallel to each switching element. Each switching element of the main conversion circuit 201 is made up of the semiconductor device according to any one of the embodiments 1 to 3 described above. The six switching elements are connected two by two in series to constitute upper and lower arms, and each pair of the upper and lower arms constitutes each phase (U phase, V phase, and W phase) of a full-bridge circuit. Output terminals of the pair of the upper and lower arms, that is to say, three output terminals of the main conversion circuit 201 are connected to the load 300.

The drive circuit 202 generates a drive signal for driving a switching element of the main conversion circuit 201, and supplies the drive signal to a control electrode of the switching element of the main conversion circuit 201. Specifically, the drive circuit 202 outputs a drive signal for making the switching element enter an ON state and a drive signal for making the switching element enter an OFF state to a control electrode of each switching element in accordance with a control signal from the control circuit 203 describe hereinafter. When the switching element is kept in the ON state, the drive signal is a voltage signal (ON signal) equal to or larger than a threshold voltage of the switching element, and when the switching element is kept in the OFF state, the drive signal is a voltage signal (OFF signal) equal to or smaller than the threshold voltage of the switching element.

The control circuit 203 controls the switching element of the main conversion circuit 201 so that a desired electrical power is supplied to the load 300. Specifically, the control circuit 203 calculates a time (on time) at which each switching element of the main conversion circuit 201 should enter the ON state based on the electrical power to be supplied to the load 300. For example, the control circuit 203 can control the main conversion circuit 201 by pulse width modulation (PWM) control modulating the on time of the switching element in accordance with the voltage to be output. Then, the control circuit 203 outputs to a control command (control signal) to the drive circuit 202 so that the ON signal is output to the switching element which should enter the ON state and the OFF signal is output to the switching element which should enter the OFF state at each point of time. The drive circuit 202 outputs the ON signal or the OFF signal as the drive signal to the control electrode of each switching element in accordance with the control signal.

In the power conversion device according to the present embodiment 4 described above, the semiconductor device according to the embodiments 1 to 3 is applied as at least one of the switching element and the reflux diode of the main conversion circuit 201, thus the power conversion device with a low loss and an improved reliability of the high speed switching can be achieved.

Described in the above present embodiment 4 is the example of applying the semiconductor device according to any one of the embodiments 1 to 3 to the three-phase inverter with two levels. However, the present embodiment 4 is not limited thereto, but can be applied to various power conversion devices. In the present embodiment 4, the semiconductor device according to any one of the embodiments 1 to 3 is the power conversion device with two levels, but may be a power conversion device with three levels or a multilevel power conversion device may also be applied. When an electrical power is supplied to a single phase load, the semiconductor device described above may be applied to a single-phase inverter. When the electrical power is supplied to a direct current load, for example, the semiconductor device described above can be applied to a DC/DC convertor or an AC/DC convertor.

The power conversion device according to the present embodiment 4 can be used not only in the case where the load described above is the electrical motor but can be used as a power source device of an electrical discharge machine, a laser beam machine, an induction heat cooking machine, or a wireless chagrining system, and further can also be used as a power conditioner of a solar power system or an electricity storage system, for example.

Each embodiment can be arbitrarily combined, or each embodiment can be appropriately varied or omitted within the scope of the invention.

The foregoing description is in all aspects illustrative, thus the present disclosure is not limited thereto. It is therefore understood that numerous modifications and variations can be devised without departing from the scope of the present disclosure.

EXPLANATION OF REFERENCE SIGNS

1 SiC substrate, 2 drift layer, 3 base region, 4 source region, 5a, 5b bottom portion protective layer, 6a, 6b oxide film, 7a gate trench, 7b source trench, 8a in-trench gate electrode, 8b in-trench source electrode, 9a, 9b sidewall connection layer, 13 on-trench source electrode, 18 depletion suppressing layer, 19 built-in electrode, 21 contact hole, 22 interlayer insulating film, 200 power conversion device, 201 main conversion circuit, 202 drive circuit, 203 control circuit.

The invention claimed is:

1. A semiconductor device, comprising:
a semiconductor part of a first conductivity type;
a drift layer of the first conductivity type disposed on a first main surface of the semiconductor part;
a base region of a second conductivity type disposed on the drift layer;
a source region of the first conductivity type selectively disposed on an upper portion of the base region;
a first trench passing through the source region and the base region to reach the drift layer;
a first protective layer of the second conductivity type disposed under or below at least part of a bottom portion of the first trench;
an in-trench gate electrode disposed adjacent to the source region and the base region via an insulating film in the first trench;
a second trench passing through the base region to reach the drift layer;
a second protective layer of the second conductivity type disposed under or below at least part of a bottom portion of the second trench;
a source electrode, at least part of which is disposed in the second trench, to be electrically connected to the first protective layer, the base region, and the source region;
a source side connection layer of the second conductivity type constituting at least part of a lateral portion of the second trench and connected to the base region and the second protective layer; and
a drain electrode disposed on a second main surface of the semiconductor part on a side opposite to the first main surface of the semiconductor part, wherein
the source electrode includes:
an in-trench source electrode disposed in the second trench; and
an on-trench source electrode electrically connected to the first protective layer, the base region, the source region, and the in-trench source electrode, the semiconductor device further comprising:
an ohmic electrode, disposed between the base region and the on-trench source electrode in a cross-sectional view, that is configured to connect the on-trench source electrode and the source region, the ohmic electrode including a portion that is coplanar with an edge of the source region connected to the second trench.

2. The semiconductor device according to claim 1, wherein the in-trench source electrode is disposed adjacent to the base region via an insulating film in the second trench.

3. The semiconductor device according to claim 1, wherein the in-trench source electrode is disposed in the second trench, electrically connected to the first protective layer, and connected to the base region, the source region, and the second protective layer.

4. The semiconductor device according to claim 2, further comprising:
an interlayer insulating film disposed on the second trench and having a contact hole exposing the in-trench source electrode, wherein
the on-trench source electrode and the in-trench source electrode are connected via the contact hole.

5. The semiconductor device according to claim 1, further comprising:
a gate side connection layer of the second conductivity type constituting at least part of a lateral portion of the first trench and connected to the base region and the first protective layer.

6. The semiconductor device according to claim 1, wherein the in-trench gate electrode includes polysilicon.

7. The semiconductor device according to claim 1, wherein
the second trench is disposed in a stripe form in a planar view, and
the source side connection layer includes plural source side connection layers disposed at intervals along a longitudinal direction of the second trench in the planar view.

8. The semiconductor device according to claim 5, wherein
the first trench is disposed in a stripe form in a planar view, and
the gate side connection layer includes plural gate side connection layers disposed at a first interval along a longitudinal direction of the first trench in the planar view.

9. The semiconductor device according to claim 1, wherein the first protective layer is disposed under or below a whole bottom portion of the first trench.

10. The semiconductor device according to claim 1, wherein the second protective layer is disposed under or below a whole bottom portion of the second trench.

11. The semiconductor device according to claim 1, wherein a width of the first protective layer is larger than a width of the first trench.

12. The semiconductor device according to claim 1, wherein a width of the second protective layer is larger than a width of the second trench.

13. The semiconductor device according to claim 1, wherein a depth of the first trench and a depth of the second trench are identical with each other.

14. The semiconductor device according to claim 1, wherein the semiconductor device is a MOSFET device.

15. The semiconductor device according to claim 1, wherein the semiconductor part includes SiC.

16. The semiconductor device according to claim 1, wherein a metal included in the ohmic electrode is different from a metal included in the source electrode.

17. A semiconductor device, comprising:
a semiconductor part of a first conductivity type;
a drift layer of the first conductivity type disposed on a first main surface of the semiconductor part;
a base region of a second conductivity type disposed on the drift layer;
a source region of the first conductivity type selectively disposed on an upper portion of the base region;
a first trench passing through the source region and the base region to reach the drift layer;
a first protective layer of a second conductivity type disposed under or below at least part of a bottom portion of the first trench;
an in-trench gate electrode disposed adjacent to the source region and the base region via an insulating film in the first trench;
a second trench passing through the base region to reach the drift layer;
a second protective layer of the second conductivity type disposed under or below at least part of a bottom portion of the second trench;
a source electrode, at least part of which is disposed in the second trench, to be electrically connected to the first protective layer, the base region, and the source region;
a source side connection layer of the second conductivity type constituting at least part of a lateral portion of the second trench and connected to the base region and the second protective layer; and
a drain electrode disposed on a second main surface of the semiconductor part on a side opposite to the first main surface of the semiconductor part,
the semiconductor device further comprising:
a gate side connection layer of the second conductivity type constituting at least part of a lateral portion of the first trench and connected to the base region and the first protective layer, wherein
the first trench is disposed in a stripe form in a planar view,
the gate side connection layer includes plural gate side connection layers disposed at a first interval along a longitudinal direction of the first trench in the planar view,
the second trench is disposed in a stripe form in the planar view, and
the source side connection layer includes plural source side connection layers disposed at a second interval different from the first interval along the longitudinal direction of the second trench in the planar view.

18. The semiconductor device according to claim 17, wherein the second interval is smaller than the first interval.

* * * * *